US007705868B2

(12) United States Patent
Masuda et al.

(10) Patent No.: US 7,705,868 B2
(45) Date of Patent: Apr. 27, 2010

(54) LIGHT EMITTING ARRAY WITH IMPROVED CHARACTERISTICS, OPTICAL WRITING UNIT, AND IMAGE FORMING APPARATUS

(75) Inventors: Koji Masuda, Yokohama (JP); Nobuo Sakuma, Inage (JP); Masahiro Ito, Asaka (JP)

(73) Assignee: Ricoh Company, Ltd., Tokyo (JP)

( * ) Notice: Subject to any disclaimer, the term of this patent is extended or adjusted under 35 U.S.C. 154(b) by 1267 days.

(21) Appl. No.: 10/891,179

(22) Filed: Jul. 15, 2004

(65) Prior Publication Data

US 2005/0067944 A1    Mar. 31, 2005

(30) Foreign Application Priority Data

| Jul. 28, 2003 | (JP) | 2003-202484 |
| Nov. 17, 2003 | (JP) | 2003-386692 |
| Apr. 5, 2004 | (JP) | 2004-111163 |

(51) Int. Cl.
*B41J 2/45* (2006.01)
(52) U.S. Cl. .................................. 347/238
(58) Field of Classification Search ................ 347/138, 347/238, 241, 244, 129, 230, 256, 258; 257/98, 257/459, 113; 313/509; 359/626
See application file for complete search history.

(56) References Cited

U.S. PATENT DOCUMENTS

| 5,936,347 A * | 8/1999 | Isaka et al. .................. 313/509 |
| 6,025,858 A * | 2/2000 | Tanioka et al. ............... 347/129 |
| 6,353,502 B1 * | 3/2002 | Marchant et al. ............. 359/626 |
| 6,480,219 B1 * | 11/2002 | Uejima et al. ................ 347/241 |
| 6,498,356 B1 * | 12/2002 | Sekiya et al. ................ 257/113 |
| 6,611,280 B1 * | 8/2003 | Shiraishi et al. ............. 347/238 |
| 6,724,414 B2 * | 4/2004 | Masuda et al. ............... 347/244 |
| 6,765,277 B2 * | 7/2004 | Chen et al. .................. 257/459 |
| 6,844,888 B2 * | 1/2005 | Nakamura ................... 347/138 |
| 7,224,379 B2 * | 5/2007 | Wong et al. .................. 347/238 |
| 2004/0135875 A1 * | 7/2004 | Wakisaka .................... 347/238 |
| 2007/0057268 A1 * | 3/2007 | Hamanaka et al. ............. 257/98 |

FOREIGN PATENT DOCUMENTS

| JP | 3-290601 | 12/1991 |
| JP | 6-151972 | 5/1994 |
| JP | 06208005 A * | 7/1994 |

(Continued)

*Primary Examiner*—Hai C Pham
(74) *Attorney, Agent, or Firm*—Oblon, Spivak, McClelland, Maier & Neustadt, L.L.P.

(57) ABSTRACT

A light emitting array including at least a plurality of light emitting elements, each of which is provided thereon with a microlens in one-to-one correspondence. Light emitting portions of the light emitting element are provided having the shape of a rectangle and formed so as to satisfy the relational expression, $Lmin \leq D \leq P$, where Lmin is the length of the shorter side of the rectangle, P an alignment pitch of the light emitting elements, and D the diameter of microlens. In addition, light emitting elements are formed in line on a transparent thin film layer to satisfy the relationship, $T1 \leq 2 \cdot D2$, where T1 is the thickness of the transparent thin film layer and D2 the diameter of each microlens. The light emitting array may suitably be included in the light source unit which is then incorporated into image forming apparatuses for forming mono-color or multiple-color images.

37 Claims, 19 Drawing Sheets

FOREIGN PATENT DOCUMENTS

| | | | |
|---|---|---|---|
| JP | 09171892 A * | 6/1997 |
| JP | 09/187991 | 7/1997 |
| JP | 10-181089 | 7/1998 |
| JP | 10-244702 | 9/1998 |
| JP | 11-170605 | 6/1999 |
| JP | 11170605 A * | 6/1999 |
| JP | 2001-119072 | 4/2001 |
| JP | 2002-164579 | 6/2002 |
| JP | 2003260812 A * | 9/2003 |

* cited by examiner

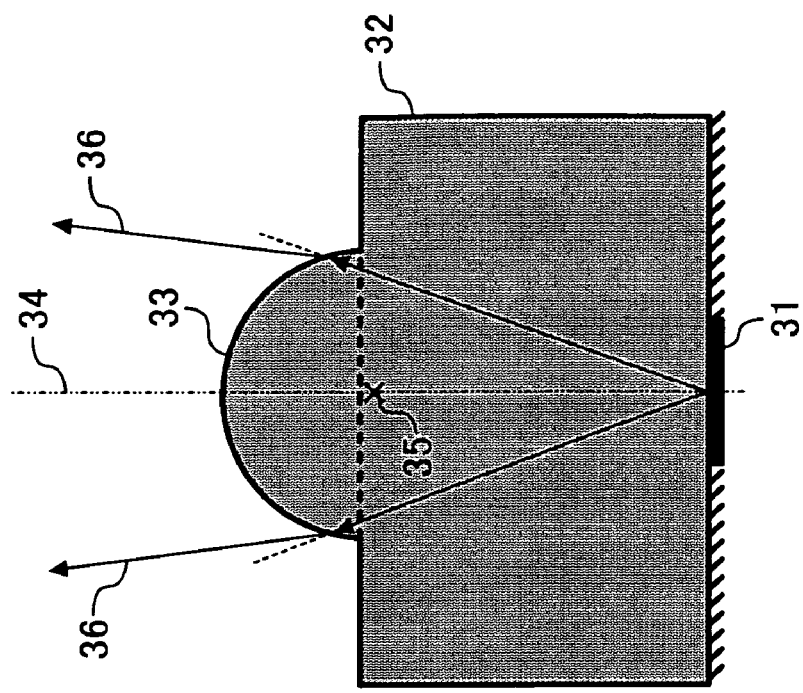
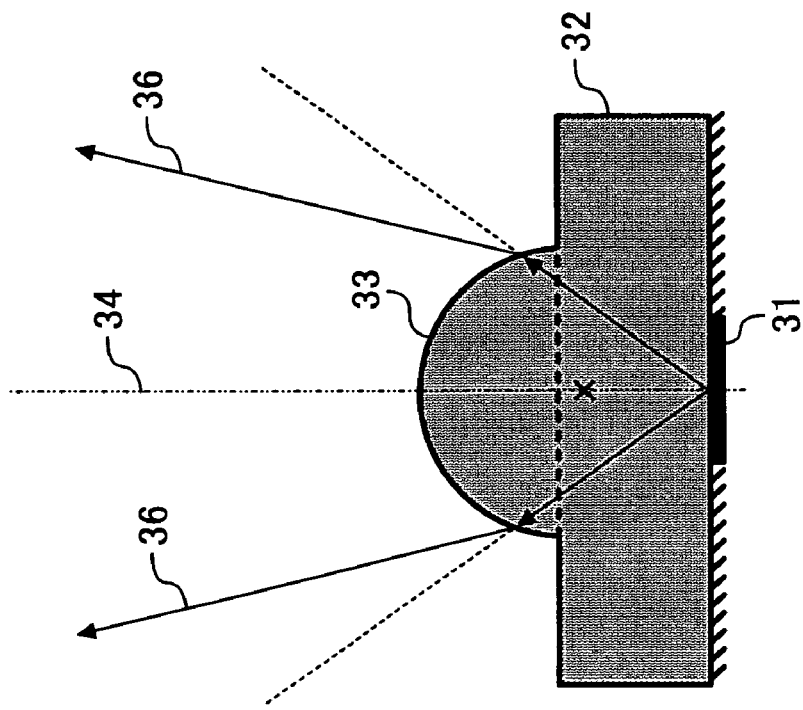

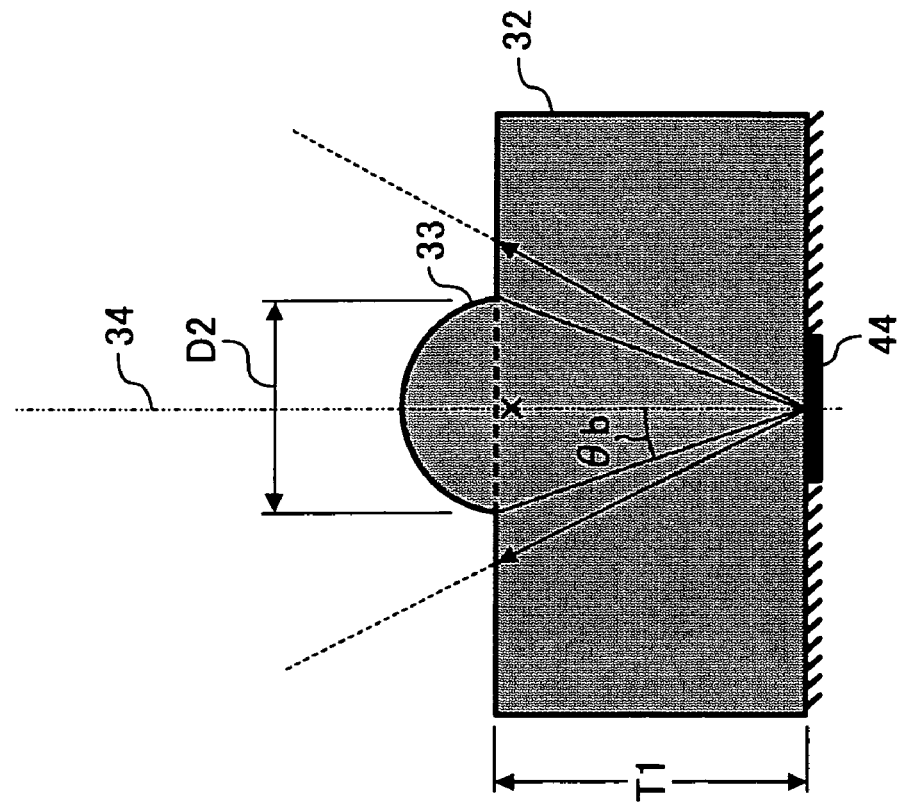
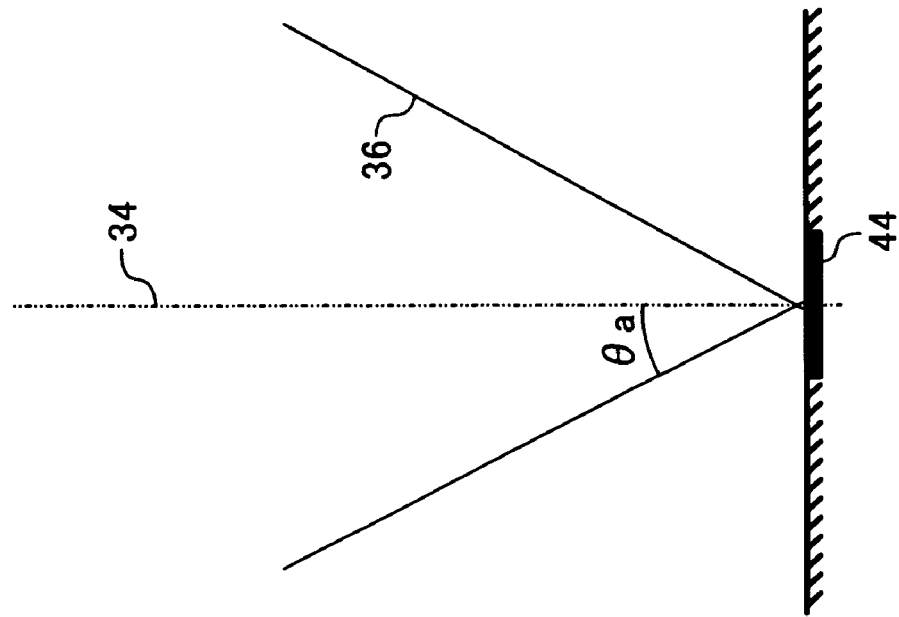

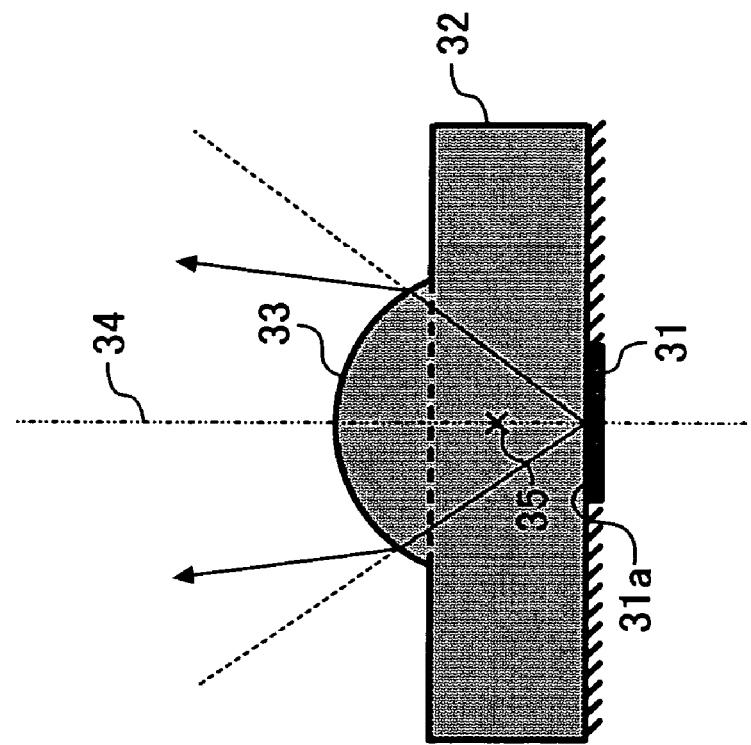
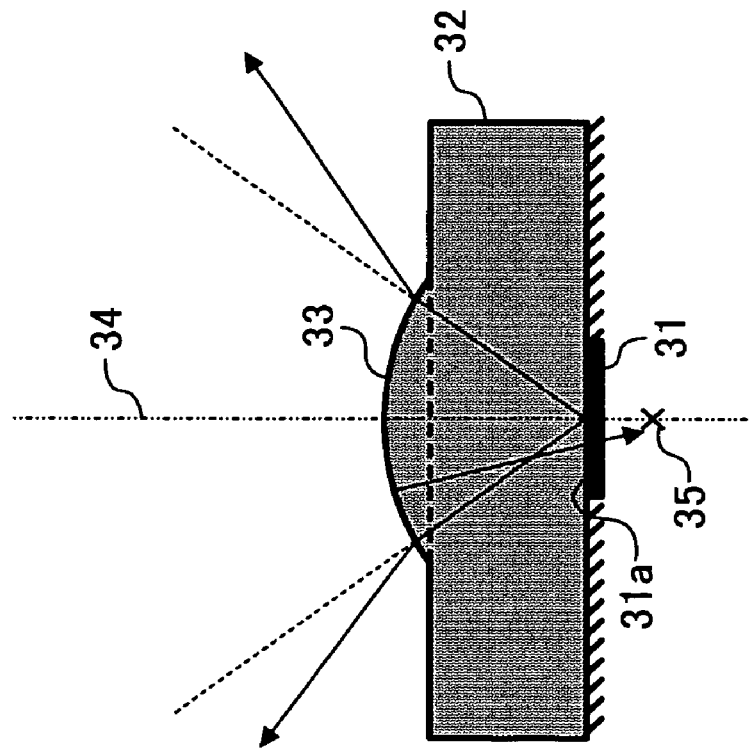
FIG. 14A
FIG. 14B

LIGHT EMITTING ARRAY WITH IMPROVED CHARACTERISTICS, OPTICAL WRITING UNIT, AND IMAGE FORMING APPARATUS

BACKGROUND

1. Field of the Invention

A light emitting array, and more specifically to light emitting arrays capable of reducing radiation angle of emerging light beams and obviating the generation of light flare, which is suitably adapted to the use in an optical writing unit and an image forming apparatus incorporating the writing unit.

2. Discussion of the Background

In the course of recent developments in downsizing digital image forming apparatuses such as a digital duplication machine, a printer, a digital facsimile and so forth, more attention has been directed to the miniaturization of an optical writing unit in use for digital signal writing.

Current methods for implementing optical writing are broadly divided into two classes. One class is a light scanning method in which a light beam emanated from a light source such as a semiconductor laser or other similar devices is scanned by a light deflecting unit to be formed subsequently as a beam spot through a scan imaging lens incident onto the surface of an image receptor.

The other class is the method utilizing a solid optical writing system, in which light beams, which emerge from the array of light emitting elements such as light-emitting diodes (LEDs) and organic electroluminescent (EL) devices, are shaped as light spots through an imaging element array to be irradiated onto a receptor.

Since the light scanning system utilizes a light deflector for scanning light beams as described above, its optical path length is relatively large to thereby give rise to a drawback of this system.

In contrast, the path length can be made considerably shorter for the solid optical writing system, which offers the key advantage in reducing the size of the writing system. In addition, since any of movable part such as the light deflecting unit is not included in this optical writing system, this also offers a further advantage in forming a quiet system driven with reduced undue noises.

The present invention concerns a light emitting array adapted to the solid optical writing method, an optical writing unit including the light emitting array, and an image forming apparatus incorporating the optical writing unit.

The optical writing unit in use for solid optical writing method will be detailed herein below. In the first place, a known solid optical writing unit is described.

This solid optical writing unit has been formed including at least a light emitting array consisting of a plurality of light emitting elements, and an imaging element array consisting of a plurality of image forming elements. The imaging element array is exemplified by an optical writing unit using a rod lens array as illustrated in FIGS. 22A and 22B.

As to the light emitting array, the array is formed by conventionally using light-emitting diodes (LEDs) as the light emitting elements and by aligning these diodes at predetermined, even intervals.

In addition, the light emitting array consisting of LEDs is formed as shown in FIGS. 22A and 22B by mounting a plurality of LED array chips 324 amounting to approximately from several tens to one hundred on a substrate 323, and the LED array chips 324 are each formed by arranging thereon LEDs amounting to from several tens to one hundred at predetermined intervals.

Furthermore, as shown in FIGS. 22 and 23, the LED array chips 324 are mounted such that LEDs 320 each placed at opposing ends of neighboring array chips 324 have a predetermined distance.

For an LED array for use in the A3 paper width, for example, the resolution of 1200 dpi (dot per inch) can be achieved by arranging sixty LED array chips each mounted with 256 LEDs at the interval of 21.2 μm.

In addition to LEDs described above, organic electroluminescent devices, semiconductor laser elements and other similar devices have been proposed for forming the light emitting array.

In the second place, the configuration in general of an imaging element array to be combined with the light emitting array will be described.

As the imaging element array used in the solid optical writing method, a rod lens array may conventionally be used which are formed of plural rod lenses 332 of the refractive-index distribution type formed as a bundle as illustrated in FIGS. 24A and 24B. The rod lenses 332 are aligned in a double line each piled in staggered position and held altogether between two opposing side plates 334. In addition, an opaque filling member is provided and solidified into the gaps between the rod lenses 332.

As shown in FIG. 21 the rod lens 322 is adapted to form an equal-magnification, erecting image of the light source by adjusting, in a predetermined manner, the distance from the entrance edge plane of the rod lens 322 to the surface of the LED array chip 324 as the light source, and from the exit edge plane of the rod lens to the surface of photoreceptor 326 as an imaging plane.

In addition to the noted rod lens array, a roof prism lens array (RPLA) is known to be used alternatively as an imaging element array, which can be formed integrally with plastics material.

Referring to FIG. 25, the roof prism lens array 120 is formed by including entrance lenses 121 for receiving light beams emanated from the light source, and exit lenses 123 for emanating the beams reflected by a roof prism 122 and for leading to the optical writing unit.

In addition, the roof prism lens array 120 is formed such that a first lens array portion 124 with plural entrance lenses 121 aligned thereon and a second lens array portion 125 with plural of the exit lenses 123 aligned thereon are configured to be perpendicular with one another, and that a roof prism portion 126 with the plural roof prism lenses 122 aligned thereon in the same aligning direction is configured between the entrance lenses 121 aligned on the first lens array portion 124 and the exit lenses 123 aligned on the second lens array portion 125.

Furthermore, the center of any one of the entrance lenses 121 provided on the first lens array portion 124, the ridge line portion 127 corresponding to the abovementioned entrance lens 121 of the roof prism portion 126, and the center of the exit lens 123 provided on the second lens array portion 125 are altogether configured to be in the direction perpendicular to that of the alignment of the abovementioned entrance lenses 121 and exit lenses 123.

A light shield material may be provided further between the lenses to prevent the transmission of undue light beams such as stray light, for example.

Light beams incident on the face of the entrance lens 121 are deflected approximately by a right angle by the roof prism 122 and subsequently emanated from the face of exit lens 123. By interposing the roof prism lens array 120 between the light source and the imaging surface, therefore, the imaging of the light source can be achieved on a prescribed surface of the image bearing member such as, for example, photoreceptor drum.

Incidentally, the noted optical systems with either the rod lens or the roof prism lens are both optical systems for forming equal-magnification, erecting images, which are adapted to receive light beams emanated from one light source with plural lens faces, emanate from further faces each provided on the side opposing to the receiving faces, and generate the image as a focused spot on an imaging surface.

For the optical writing unit in use for solid optical writing method using imaging element array incorporating the rod lens or the roof prism lens, it is generally known the light emanated from light emitting elements can be transmitted onto the photoreceptor, as an image bearing member, in the proportion of merely few percent (about from 1 to 5 percent).

Although it is necessary to transmit a predetermined amount of light (or light intensity) to properly carry out light exposure onto the surface of photoreceptor, as the image bearing member, the light intensity generally comes to decrease during the passage through imaging element array.

Therefore, it is desirable to increase the intensity of light transmitted to the photoreceptor, and accordingly this may be achieved by increasing the light intensity itself by means of the increase in current input to the light emitting elements, for example.

The noted means for increasing current input, however, results in a concomitant increase of power consumption. Therefore, it is desirable to increase the intensity of light transmitted to the photoreceptor without increasing the intensity itself of light emission from the light emitting elements. This necessitates increasing light transmission efficiency of optical systems in use for the optical image writing.

Several means may be cited for increasing light transmission efficiency such as (1) using a lighter (or less dark) imaging element array, (2) in place of the imaging element array, utilizing microlenses for converging light beams emanated from the light emitting elements directly on the photoreceptor as a light spot, and/or (3) appending an optical device capable of improving light transmission efficiency to the existing imaging element array.

As to the noted means (1), for example, there may be provided the improvement in opening ratio of the rod lens array. This is, however, considered difficult at present since a rod lens array is hard to be formed so as to attain light spot characteristics uniform enough over receptor area for obtaining satisfactory pictorial images while maintaining the opening ratio improvement, as well.

In the means (2) mentioned above, the method has been disclosed in which plural microlenses and waveguide structures are formed both being brought into one-to-one correspondence with light emitting elements. As a result, light spots are formed on a photoreceptor without intervening imaging element array (for example, in Japanese Laid-Open Patent Applications No. 9-187991 and 10-181089).

In this method, however, since the optical system for imaging is formed primarily with the microlenses, the characteristics of light spots on the photoreceptor are considerably influenced by the form accuracy of the microlenses after assuming light emitting diodes are produced with sufficient uniformity of light emission.

Thus, there gives rise to a drawback of this method in which the variation of the shape of microlenses manifests itself as that of the characteristics of light spots on the photoreceptor, and this may prevent the formation of satisfactory picture images.

Although it is thus necessary to form uniform microlenses to form excellent images, such images are difficult to be acquired under the present conditions. In addition, it is also difficult the light beams emanated from light emitting diodes are all led to form spots on the photoreceptor (the proportion of 90 percent level is cited in the application '991). The rest of the beams are still emitted from LEDs toward the photoreceptor only resulting in undue light flare onto the photoreceptor.

It is disclosed in the application '991 that light beams emanated from light emitting elements are led by way of light guides and focused by lenses to form light spots on the photoreceptor. Even though the generation of the light flare is decreased to a certain extent by the light guides, the focusing characteristics is considerably influenced by the form accuracy of the lens provided in the light guide structure.

As a result, there gives rise to a drawback in which the variation of the shape of microlenses reveals itself as that of the characteristics of light spots on the photoreceptor, and this may prevent the formation of satisfactory picture images.

In addition, a further drawback is alluded to in that process steps required for forming the light guide structure are complicated because the light guides are formed by etching and their lens portions have to be fabricated through photolithography and etching process steps.

As to the means (3) noted above, an improvement has been disclosed in light transmission efficiency of optical system, which is attained by combining a lens array capable of narrowing the radiant angle of light emitting elements with the existing imaging element array (for example, the Japanese Laid-Open Patent Application No. 11-170605).

In the method described in the application '605, however, difficulties may arise. Namely, since the lens array for narrowing the radiant angle of light emitting elements is fabricated on the surface of a transparent substrate having a certain thickness, light emerging from the next and/or second next lens may result in light flare because of the substrate thickness even the surface areas between the neighboring lenses are adapted beforehand to shield light. This may unduly affect the transmission efficiency.

In addition, the light reflected by the surface of the lenses and light shielding layers may propagate through, and discharged from the transparent substrate. This may also be one of the causes for generating light flare. FIG. 26 is prepared for illustrating the modes of transmission of the light flare.

Besides the abovementioned means for improving light transmission efficiency of optical system, a method has been disclosed (in Japanese Laid-Open Patent Application No. 2002-164579, for example) of increasing the intensity of light emanated from light emitting elements without increasing current input, in which a microlens is provided to each of the light emitting elements and which the existing optical imaging system is utilized as it is.

According to this method, since the optical capability is retained as that of the existing system and the microlens has little imaging function by itself, several difficulties can be alleviated such as undue increase of, and relatively easy increase in variation of spot size on imaging surface.

In the method described above in the application '579, however, since the microlens is provided directly on a light emitting plane of the light emitting element, it is difficult to make the apex height for the microlens larger than its curvature radius, and accordingly to reduce the radiation angle of the light beams emanated from the light emitting element.

In addition, since the shape of the microlens is considerably dependent on the gradient of the base of light emitting element, possible variation of the shape over respective microlenses may cause to the fluctuation of light intensity of the spots.

Still in addition, a further method has been disclosed (in Japanese Laid-Open Patent Application No. 2001-119072, for example) of reducing the radiation angle without using microlenses. Namely, cylindrical micro mirrors are provided to encapsulate each of light emitting illuminants such that light beams emerging from the element having a relatively large radiation angle are reflected by the micro mirror to be confined within a reduced radiation angle.

This method described in the application '072 appears effective in reducing the radiation angle of light beams having a relatively large radiation angle.

However, in order to reduce with this method the radiation angle of light beams emerging in larger angles such as approximately from 30° to 40°, the height of the micro mirrors has to be increased. This may result in drawbacks such as difficulty in forming micro mirrors having proper thickness and/or unduly enlarged light spot caused by light reflected by mirror surfaces and the method does not appear favorable in practice.

SUMMARY OF THE INVENTION

Accordingly, it is an object of the present invention to provide a light emitting array, having most, if not all, of the advantages and features of similar employed units, while eliminating many of the aforementioned disadvantages.

It is another object of the invention to provide a light emitting array capable of reducing radiation angle of emerging light beams and obviating the generation of light flare.

It is still another object to provide a light emitting array with reduced light energy loss during the transmission to a photoreceptor, which is suitably adapted to the use in optical writing unit.

It is another object to provide an image forming apparatus with higher imaging speeds and excellent imaging capabilities incorporating the optical writing unit.

The following description is a synopsis of only selected features and attributes of the present invention. A more complete description thereof is found below in the section entitled "Description of the Preferred Embodiments"

To achieve the foregoing and other objects, a light emitting array is provided including at least a plurality of light emitting elements, each of which is provided thereon with a microlens in one-to-one correspondence, in which the microlens is hemispherical in shape and separated from a microlens neighboring thereto.

In addition, the light emitting portion of the light emitting element is provided having the shape of rectangle and formed so as to satisfy the relational expression, $Lmin \leq D \leq P$, where Lmin is the length of the shorter side of the rectangle, P an alignment pitch of the light emitting elements, and D the diameter of the microlens.

The light emitting array disclosed herein may alternatively be formed with light emitting elements each having far-field emission angle characteristics of Lambert distribution.

The microlens included in the light emitting array may be formed of a transparent photoresist material on the light emitting elements formed in advance on a wafer.

According to another aspect, a light source unit is provided including at least a light emitting array comprising a plurality of light emitting elements formed in line, a transparent thin film layer formed on the light emitting array by laminating a material substantially transparent at an emission wavelength of light emitting elements, and a plurality of microlenses formed on the transparent thin film layer to be in one-to-one correspondence to the plurality of light emitting elements, in which the light source unit is formed so as to satisfy a further specified relational expression between the thickness of transparent thin film layer and the diameter of each microlens.

In addition, the light source unit is formed such that the center of curvature of each of the microlenses is situated between a light emitting plane of each of the light emitting elements and each of the microlenses opposing to the light emitting plane.

Furthermore, a film layer opaque at an emission wavelength of the light emitting elements may further be provided in the light source unit for light shielding on the surface area other than an effective area of curved surfaces of the plurality of microlenses. The light emitting elements included in the light source unit may be provided each with LEDs of the self-scanning type.

According to still another aspect, an optical writing unit is provided incorporating any one of the above mentioned light emitting arrays.

For example, a light source unit is provided including a plurality of light emitting elements and an imaging optical system configured to form images of the plurality of light emitting elements, in which each of the elements is provided thereon with a microlens in one-to-one correspondence, and the microlens is hemispherical in shape and separated from a further microlens neighboring thereto.

Alternatively, a further optical writing unit is provided including a light source unit, and an imaging optical system configured to form images of a plurality of light emitting elements.

The light source unit includes herein a light emitting array comprising the plurality of light emitting elements formed in line, a transparent thin film layer formed on the light emitting array by laminating a material substantially transparent at an emission wavelength of the light emitting elements, and a plurality of microlenses formed on the transparent thin film layer to be in one-to-one correspondence to the plurality of light emitting elements.

In addition, the light source unit is formed through adjustment of the lens diameter of, and the radius of curvature of the microlens, the alignment pitch of light emitting elements, and the thickness of the transparent thin film layer such that the angle between the optical axis and a line segment, which connects the center of light emitting plane of an arbitrary light emitting element and the center of curvature of a neighboring microlens, is at least twice the aperture angle of the imaging optical system.

Alternatively still, a still further optical writing unit is provided including a light source unit, and an imaging optical system configured to form images of a plurality of light emitting elements.

In addition, the optical writing unit herein is provided with the construction similar to that mentioned just above except that the light source unit included in the optical writing unit is formed through adjustment of the lens diameter of, and the radius of curvature of the microlens, the alignment pitch of the light emitting elements, and the thickness of the transparent thin film layer such that the angle between the optical axis and a line segment, which connects the edge of a light emitting plane of an arbitrary light emitting element and the center of curvature of a neighboring microlens, is at least twice an aperture angle of the imaging optical system, in place of the angle between the optical axis and a line segment, which connects the center of a light emitting plane of an arbitrary light emitting element and the center of curvature of a neighboring microlens.

According to another aspect, an image forming apparatus for forming mono-color images is provided incorporating any one of the above mentioned optical writing units.

For example, an image forming apparatus for forming mono-color images is provided including at least an optical writing unit as an exposure unit that includes a light source unit comprising a plurality of light emitting elements, and an imaging optical system configured to form images of the plurality of light emitting elements, in which each of the elements is provided thereon with a microlens in one-to-one correspondence, and the microlens is hemispherical in shape and separated from a microlens neighboring thereto.

Alternatively, a further image forming apparatus for forming mono-color images is provided including at least an optical writing unit as an exposure unit that includes a light source unit, and an imaging optical system configured to form images of a plurality of light emitting elements.

The light source unit includes herein a light emitting array comprising the plurality of light emitting elements formed in line, a transparent thin film layer formed on the light emitting array by laminating a material substantially transparent at an emission wavelength of the light emitting elements, and a plurality of microlenses formed on the transparent thin film layer to be in one-to-one correspondence to the plurality of light emitting elements.

In addition, the light source unit is formed through adjustment of the lens diameter of, and the radius of curvature of the microlens, the alignment pitch of light emitting elements, and the thickness of the transparent thin film layer such that the angle between the optical axis and a line segment, which connects the center of light emitting plane of an arbitrary light emitting element and the center of curvature of a neighboring microlens, is at least twice the aperture angle of the imaging optical system.

Alternatively, a image forming apparatus for forming mono-color images is provided with the construction similar to that mentioned just above except that the light source unit included in the optical writing unit is formed through adjustment of the lens diameter of, and the radius of curvature of the microlens, the alignment pitch of the light emitting elements, and the thickness of the transparent thin film layer such that the angle between the optical axis and a line segment, which connects the edge of a light emitting plane of an arbitrary light emitting element and the center of curvature of a neighboring microlens, is at least twice an aperture angle of the imaging optical system, in place of the angle between the optical axis and a line segment, which connects the center of a light emitting plane of an arbitrary light emitting element and the center of curvature of a neighboring microlens.

According to another aspect, image forming apparatuses for forming multiple-color images are provided incorporating any one of the above mentioned optical writing units.

In this case, however, the optical writing unit is used as an exposure unit in use for multiple colors in common, that is, the unit operates to form the images in multiple-colors which are formed one color at a time repeated one by one successively.

Therefore, an image forming apparatus for forming multiple-color images is provided including at least an optical writing unit as an exposure unit that includes a light source unit comprising a plurality of light emitting elements, and an imaging optical system configured to form images of the plurality of light emitting elements, in which each of the elements is provided thereon with a microlens in one-to-one correspondence, and the microlens is hemispherical in shape and separated from a microlens neighboring thereto.

Alternatively, a further image forming apparatus for forming multiple-color images is provided including at least an optical writing unit as an exposure unit that includes a light source unit comprising a plurality of light emitting elements, and an imaging optical system configured to form images of a plurality of light emitting elements, in which the light source unit includes at least a light emitting array comprising the plurality of light emitting elements formed in line, a transparent thin film layer formed on the light emitting array by laminating a material substantially transparent at an emission wavelength of the light emitting elements, and a plurality of microlenses formed on the transparent thin film layer to be in one-to-one correspondence to the plurality of light emitting elements.

In addition, the light source unit is formed through adjustment of the lens diameter of, and the radius of curvature of the microlens, the alignment pitch of light emitting elements, and the thickness of the transparent thin film layer such that the angle between the optical axis and a line segment, which connects the center of light emitting plane of an arbitrary light emitting element and the center of curvature of a neighboring microlens, is at least twice the aperture angle of the imaging optical system.

Alternatively, a further image forming apparatus for forming multiple-color images is provided with the construction similar to that mentioned just above except that the light source unit included in the optical writing unit is formed through adjustment of the lens diameter of, and the radius of curvature of the microlens, the alignment pitch of the light emitting elements, and the thickness of the transparent thin film layer such that the angle between the optical axis and a line segment, which connects the edge of a light emitting plane of an arbitrary light emitting element and the center of curvature of a neighboring microlens, is at least twice an aperture angle of the imaging optical system, in place of the angle between the optical axis and a line segment, which connects the center of a light emitting plane of an arbitrary light emitting element and the center of curvature of a neighboring microlens.

According to another aspect, an image forming apparatus for forming multiple-color images is provided including at least a plurality of optical writing units each in use for respective multiple colors as exposure units.

For example, this image forming apparatus for forming multiple-color images is provided including a plurality of the above mentioned optical writing units each in use for respective multiple colors as exposure units, each of which includes a light source unit comprising a plurality of light emitting elements, and an imaging optical system configured to form images of the plurality of light emitting elements, in which each of the elements is provided thereon with a microlens in one-to-one correspondence, and the microlens is hemispherical in shape and separated from a microlens neighboring thereto.

Alternatively, a further image forming apparatus for forming multiple-color images is provided including at least a plurality of the above mentioned optical writing units as exposure units, each of which includes a light source unit comprising a plurality of light emitting elements, and an imaging optical system configured to form images of the plurality of light emitting elements, in which the light source unit includes at least a light emitting array comprising the plurality of light emitting elements, a transparent thin film layer formed on the light emitting array by laminating a material substantially transparent at the emission wavelength of light emitting elements, and a plurality of microlenses formed on the transparent thin film layer to be in one-to-one correspondence to the light emitting elements, and in which the light source unit is formed through adjustment of the lens diameter of, and the radius of curvature of the microlens, the alignment pitch of light emitting elements, and the thickness of the transparent thin film layer such that the angle between the optical axis and a line segment, which connects the center of a light emitting plane of an arbitrary light emitting element and the center of curvature of a neighboring microlens, is at least twice an aperture angle of the imaging optical system.

Alternatively, an image forming apparatus for forming multiple-color images is provided with the construction similar to that mentioned just above except that the light source unit included in the optical writing unit is formed through adjustment of the lens diameter of, and the radius of curvature of the microlens, the alignment pitch of the light emitting elements, and the thickness of the transparent thin film layer such that the angle between the optical axis and a line segment, which connects the edge of a light emitting plane of an arbitrary light emitting element and the center of curvature of a neighboring microlens, is at least twice an aperture angle of the imaging optical system, in place of the angle between the optical axis and a line segment, which connects the center of a light emitting plane of an arbitrary light emitting element and the center of curvature of a neighboring microlens.

As described herein below, the units and apparatuses disclosed herein can offer several advantages over similar apparatuses previously known.

Namely, the light emitting array is formed having several improved capabilities such as reduced radiation angles, obviated generation of light flare, and increased light transmission efficiency.

The light emitting array may suitably be incorporated into the light source unit together with a transparent thin film layer and microlenses, and image forming apparatuses for forming mono-color or multiple-color images may be formed incorporating the optical writing units.

Thus, it becomes feasible that electrophotographic images can be output with excellent image characteristics at higher speeds, and that images in a certain color on demand can be output at higher speeds.

The present invention and features and advantages thereof will be more readily apparent from the following detailed description and appended claims when taken with drawings.

BRIEF DESCRIPTION OF THE DRAWINGS

In the following drawings, like references numerals will be used to refer to like elements in the various drawings, in which:

FIG. 12A is a side view illustrating a light source unit to be incorporated into the light emitting array including at least light emitting elements, a transparent thin film layer, and microlenses according to another embodiment disclosed herein;

FIG. 12B is a side view illustrating a further light source unit to be incorporated into the light emitting array including at least light emitting elements, a transparent thin film layer, and microlenses, in which a decrease in the angle of incoming light beams may be caused by a too large thickness of transparent thin film layer;

FIG. 13A is a drawing generally illustrating a structure including a light emitting element without transparent thin film layer and microlens;

FIG. 13B is a drawing generally illustrating the structure similar to that of FIG. 13A additionally provided with a transparent thin film layer formed covering the light emitting element;

FIG. 14A is a side view illustrating a light source unit to be incorporated into the light emitting array including at least a light emitting element, a transparent thin film layer, and a microlens, in which the microlens is placed such that its center of curvature is positioned further away of a light emitting element viewed from the surface of the microlens, and light beams emergent from the light emitting element are not converged but refracted to be divergent on passing through the microlens;

FIG. 14B is a side view illustrating the light source unit similar to that of FIG. 14A, in which a microlens with a different curvature is provided to be placed such that its center of curvature is positioned closer to the light emitting element viewed from the surface of the microlens;

DESCRIPTION OF THE PREFERRED EMBODIMENTS

In the detailed description which follows, specific embodiments of a light emitting array and an optical writing unit incorporating the arrays are primarily described.

It is understood, however, that the present invention is not limited to these embodiments. For example, it is appreciated that improved capabilities of the light emitting array may also be adaptable to any form of image forming apparatuses. Other embodiments will be apparent to those skilled in the art upon reading the following description.

In reference to several drawings, a light emitting array, and an optical writing unit and an image forming apparatus incorporating the writing unit will be described herein below.

Figures 1A, 1B:
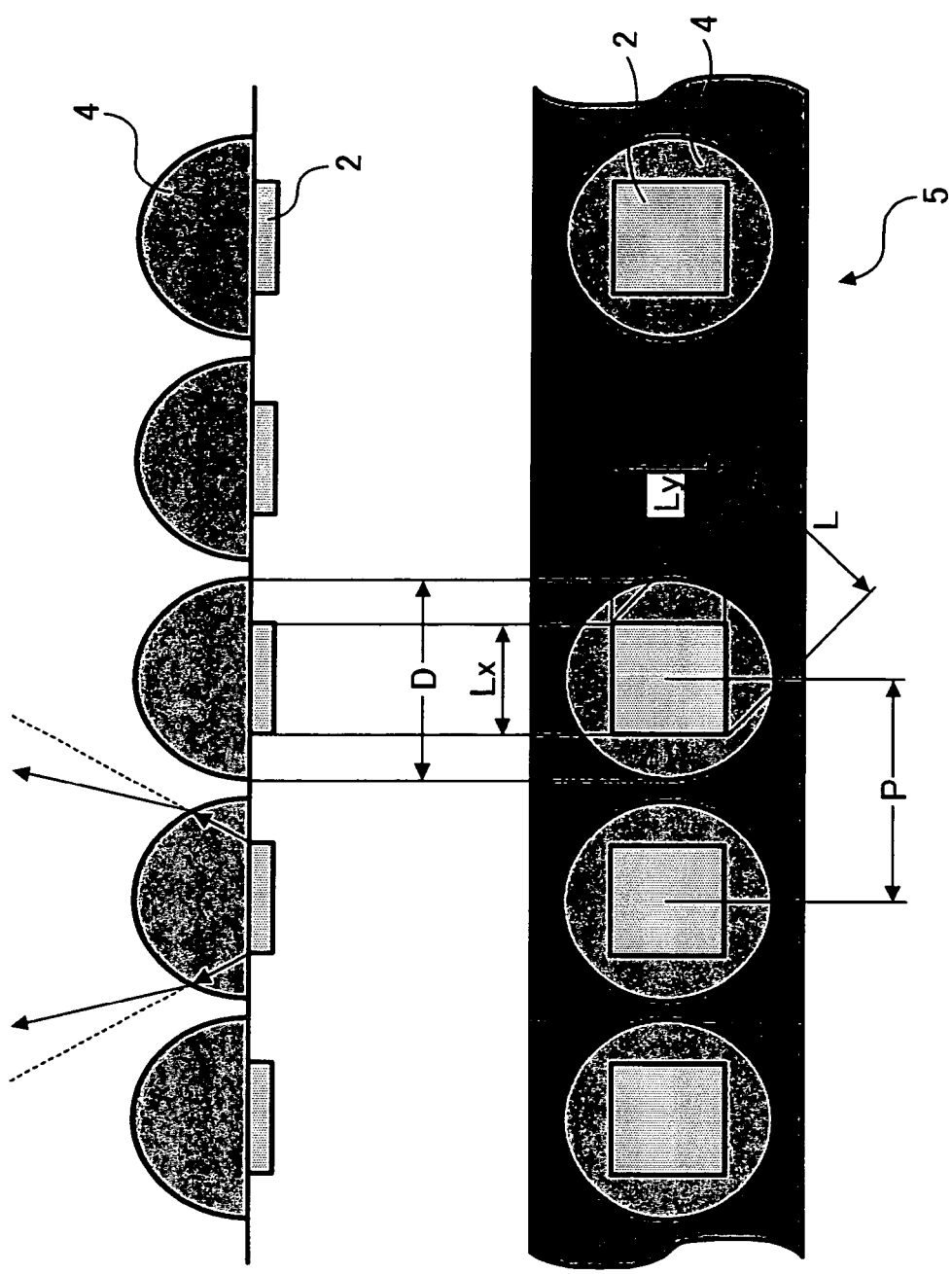
FIG. 1A is a section view along the optical axis direction diagrammatically illustrating the light emitting array provided with LEDs as light emitting elements according to one embodiment disclosed herein.
FIG. 1B is a top view illustrating the light emitting array of FIG. 1A.

FIGS. 1A and 1B are drawings for illustrating a light emitting array provided with LEDs as light emitting elements 2 according one embodiment disclosed herein.

Referring to FIGS. 1A and 1B, a light emitting array 5 includes at least a plurality of light emitting elements 2 and plural microlenses 4 which are each formed in one-to-one correspondence on each of the emitting elements 2.

The microlenses 4 are arranged so as to be separated from at least one neighboring microlens. In addition, the microlenses 4 are each formed in the shape of the hemisphere which assumes the shape acquired by dividing one sphere exactly in two, and the array 5 is formed by adhering circular surface of the hemispheres closely to the surface of the light emitting elements 2.

FIG. 1A is a section view along the optical axis direction of the light emitting array 5.

FIG. 1B is a further section view along the direction perpendicular to the optical axis.

As illustrated in FIG. 1A, light beams emanated from an LED as light emitting element 2 are refracted by the faces of the microlens opposing to the LED so the radiation angle of the beams are decreased.

In addition, since the microlenses 4 are mounted separately from each other and no light is transmitted between the lenses, light flare can be reduced for the light emitting array 5.

Furthermore, since the microlenses 4 are each hemispherical in shape, this facilitates processing thereof which can be carried out with relative ease, for example, by utilizing the forces of nature such as surface tension and other similar forces. This is advantageous for low cost processing to be implemented over other possible shapes of microlenses exemplified by ones of non-spherical and of anamorphic.

Since the microlenses 4 are mounted separately from each other as mentioned earlier in FIGS. 1A and 1B, a conditional expression is deduces as $$D \leq P,$$

where P is an alignment pitch of LEDs and D is the diameter of the microlens.

Figure 2:
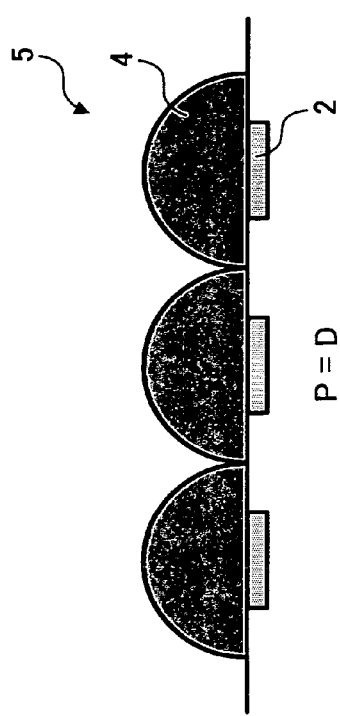
FIG. 2 is a section view along the optical axis direction illustrating the light emitting array provided with LEDs as light emitting elements in the case of D=P according to one embodiment disclosed herein.

It may be added the mode of the mounting illustrated in FIGS. 1A and 1B corresponds to the case of $D \leq P$, while FIG. 2 corresponds to the case of $D=P$.

In the case where the portion of light emission of the light emitting element 2 is smaller than that of the microlens 4, the light beams emitted from the light emitting element 2 are treated by dividing into two, those passing through the microlens 4 and the others not. As a result, no effect of reducing the radiation angle described earlier is expected for the latter beams.

Since the light emitting portion of light emitting element 2 is generally approximated rectangular in shape, by forming a microlens 4 with its diameter larger than at least the shorter side of the rectangle, the effect of reducing the radiation angle of the light beams emanated from light emitting element 2 can be brought about along the direction of the shorter side.

It is preferable that the microlens 4 is formed so as to cover the light emitting portion completely.

Given the length Lmin for the shorter side of the rectangle as an approximated light emitting portion of light emitting element 2, a condition for the microlens 4 to completely cover the light emitting portion along the shorter side is Lmin≦D.

Hence, a further relationship is obtained as

Lmin≦D≦P.

In addition, given a length of L for the diagonals of the rectangle as an approximated light emitting portion of light emitting element 2, a condition for the microlens 4 to completely cover the light emitting portion along the shorter side is

L≦D.

Hence, it is preferable to fulfill a relational expression

L≦D≦P.

Figure 3:
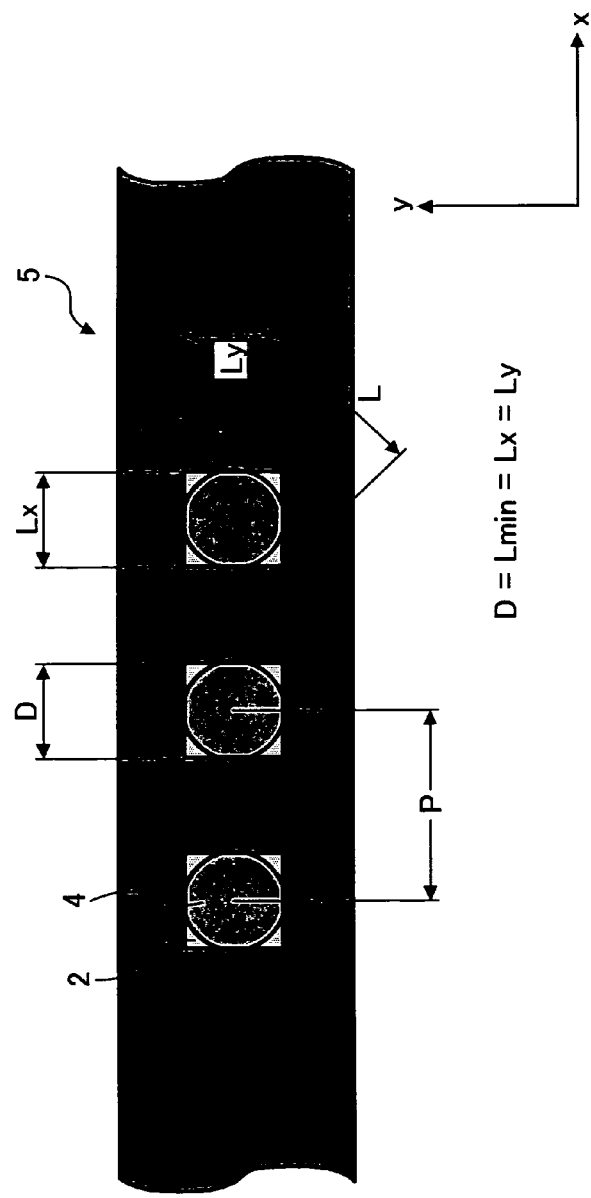
FIG. 3 is a top view illustrating light emitting elements each provided with light emitting portions formed square in shape according to one embodiment disclosed herein.

FIG. 3 is a drawing illustrating light emitting elements 2 each provided with light emitting portions formed square in shape.

As described earlier, the microlenses 4 are each formed in the shape of the hemisphere with their circular surfaces adhered closely to the surface of the light emitting elements 2.

Since the portions of light emission of the light emitting elements 2 each formed approximately square in shape as shown in FIG. 3, the following relationship holds, Lx=Ly, where Lx and Ly are the lengths for the sides of the square, along the x- and y-directions, respectively.

In addition, given the lengths, Lm for the shorter side and L for the diagonals, the relations are obtained, Lmin=Lx=Ly, and $L=(\sqrt{2})Lx=(\sqrt{2})Ly$.

As a result, given the length Lmin for the shorter side of the rectangular light emitting portion of light emitting element 2, the condition for the microlens 4 to completely cover the light emitting portion along the shorter side is Lmin≦D.

Figure 4:
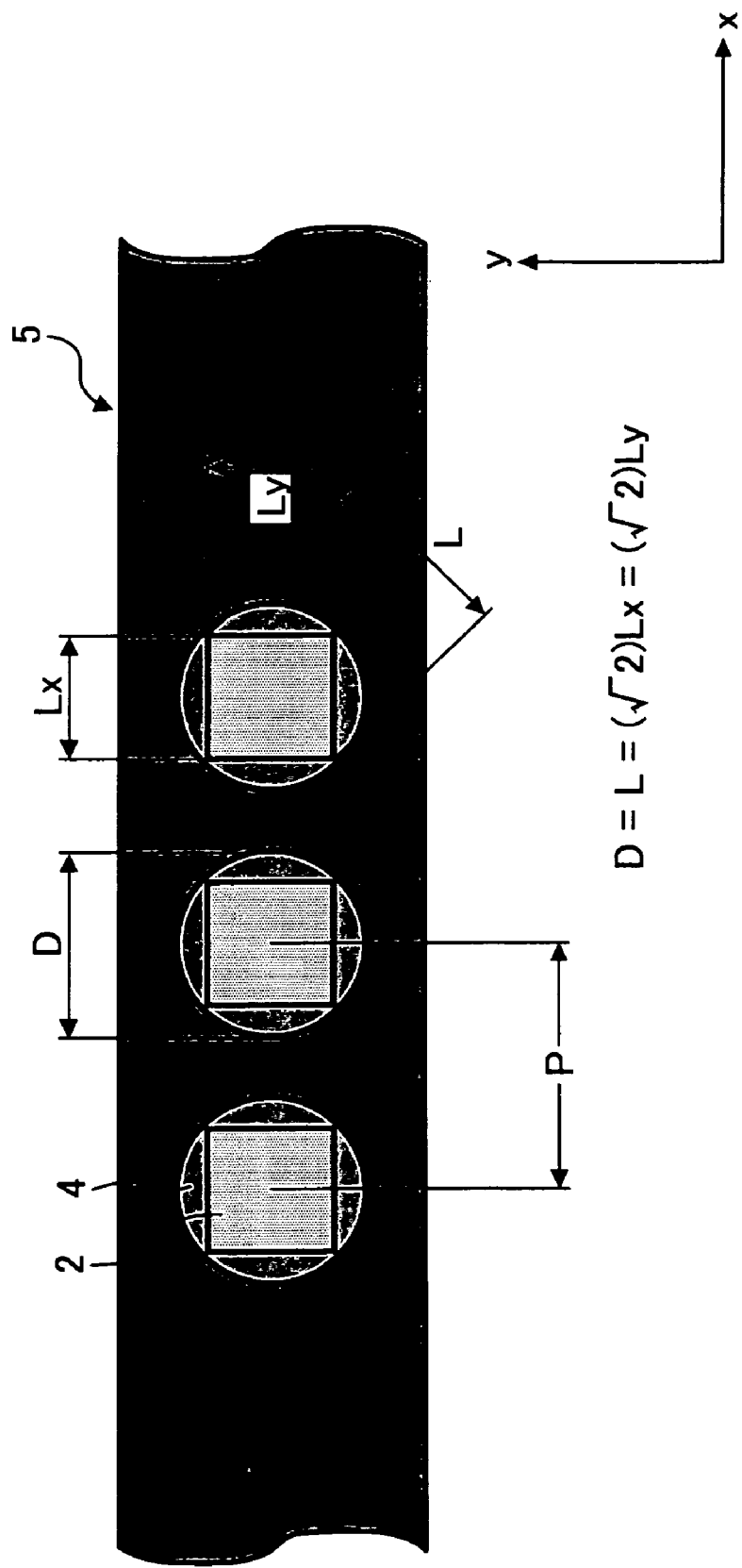
FIG. 4 is a top view illustrating light emitting elements each provided with light emitting portions formed square in shape according to one embodiment disclosed herein, in which microlenses are formed each completely covering the square light emitting portions.

In addition, as shown in FIG. 4, the condition for the microlens 4 to completely cover the square light emitting portions is obtained as

L≦D.

FIG. 3 is a drawing for illustrating light emitting elements 2 each provided with light emitting portions formed rectangular in shape.

Some light emitting arrays have recently been provided with LED elements having a skewered structure by a common electrode through light emitting portions, in which the abovementioned rectangular shapes may result for light emitting portions.

Given the lengths, Lx and Ly, for the sides of light emitting portions along, and perpendicular to, the alignment of the light emitting array, respectively, the length of the shorter side of the rectangle, Lmin, and of diagonals, L, are obtained as Lmin=Ly, and $L=\sqrt{(Lx^2+Ly^2)}$.

Figure 5:
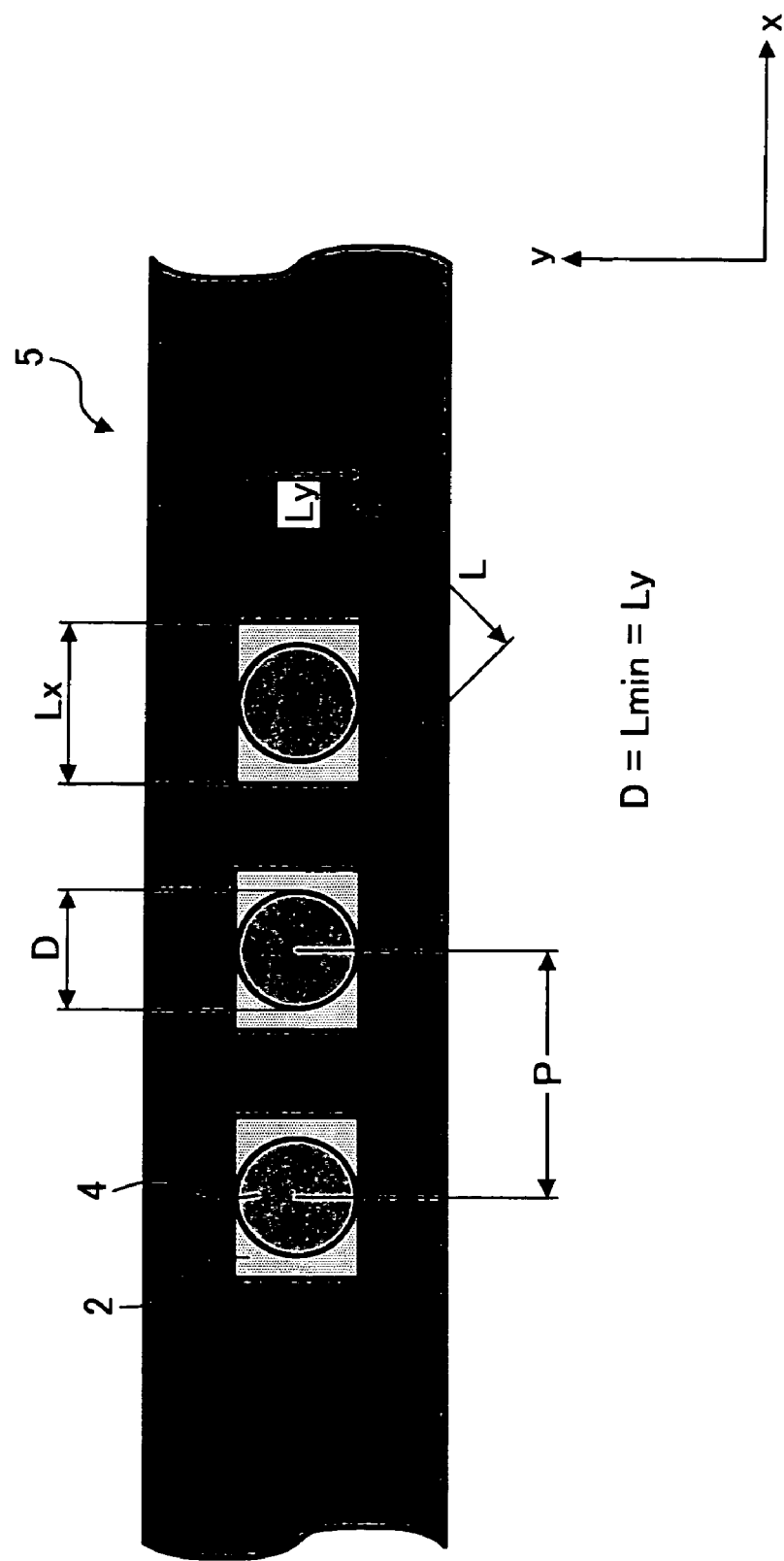
FIG. 5 is a top view illustrating light emitting elements each provided with light emitting portions formed rectangular in shape, in which the microlens diameter is equal to the length of the shorter side of the square.

As a result, given the length Lmin for the shorter side of the rectangular light emitting portion of light emitting element 2, the condition for the microlens 4 to cover the light emitting portion along the shorter side (FIG. 5) is Lmin≦D.

Figure 6:
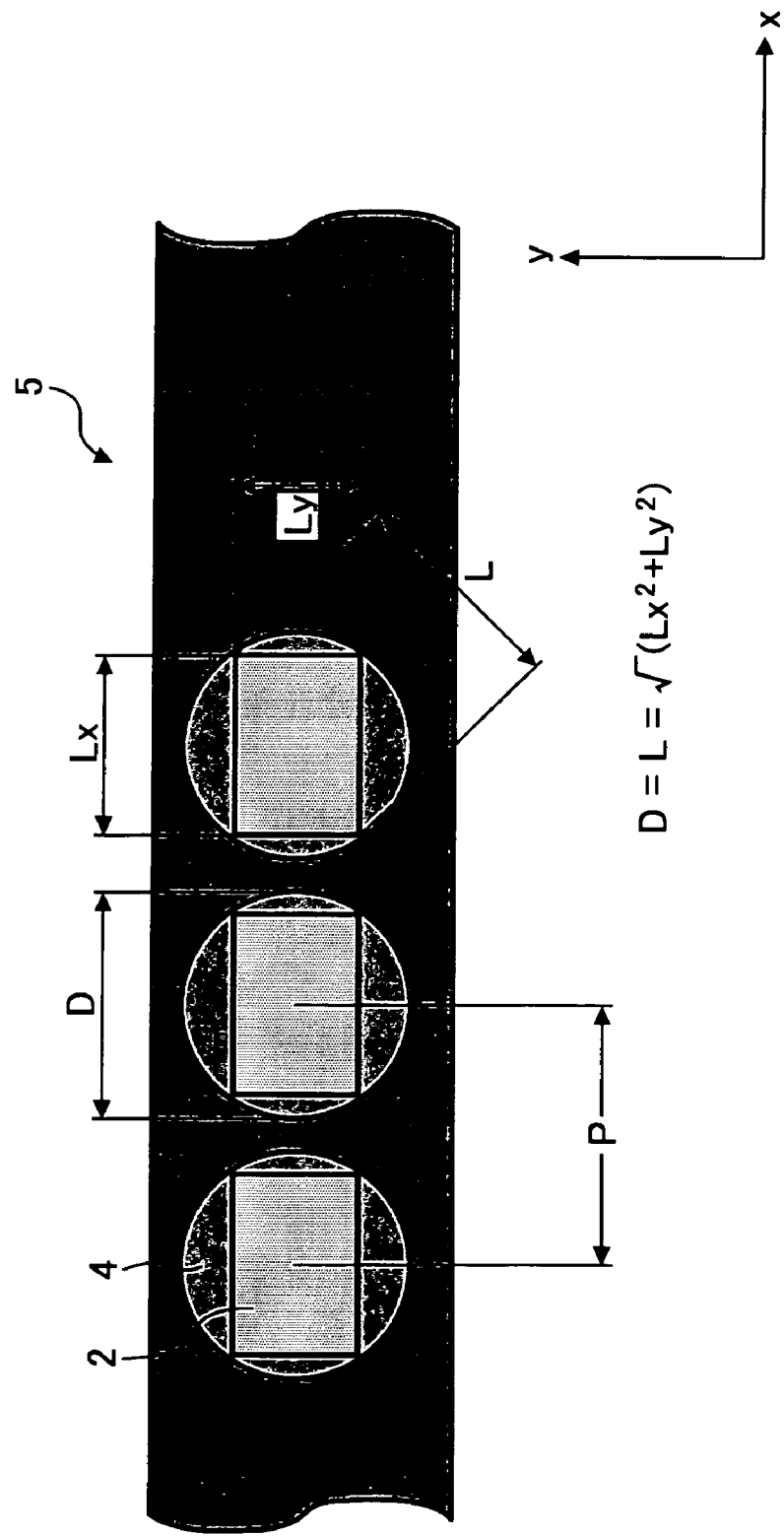
FIG. 6 is a top view illustrating light emitting elements each provided with light emitting portions formed rectangular in shape, in which microlenses are formed each completely covering the rectangular light emitting portions.

In addition, the condition for the microlens 4 to completely cover the square light emitting portions (FIG. 6) is obtained as

L≦D.

An LED array conventionally utilized as the light emitting array consists of plural LED array chips amounting to approximately from several tens to one hundred mounted on a substrate 323, and the LED array chips are each structured by arranging thereon LEDs amounting to from several tens to one hundred. In addition, the plural LED array chips are generally formed through dicing from a wafer.

Although the noted microlenses may be formed for each LED array chip, this isn't an efficient way because of possible difficulty in proper positioning of each of the microlenses with respect to corresponding LED and in handling the array chip, as well.

It is therefore desirable that microlenses are formed in advance onto LEDs on a wafer, and then subjected to dicing to obtain LED array chips, which is advantageous from mass production point of view, as well.

Furthermore, a self-scanning light emitting device (SLED) has recently been disclosed with a structure different from that previously known, which may suitably be in use for forming the light emitting array of the present invention.

Next, a method of forming microlenses will be described herein below.

A plurality of LEDs are formed first on a wafer through known process steps. The surface area of thus prepared structure is then coated with a photoresist as the material for forming the microlenses. As to the coating, known methods may be used such as spray coating, for example. Subsequently, the portions to be disused in forming the microlenses are removed by known etching steps. The microlenses are then formed by the reflow technique.

Since the LEDs are formed in a well positioned manner through the noted process steps, it is desirable the microlenses are also formed in a corresponding precision. Therefore, the abovementioned method can be quite advantageous to proper positioning and mass productivity, which is capable of forming microlenses with high precision through the steps of etching and reflow.

As the material for forming the microlenses, other similar materials such as, for example, $SiO_2$ may also be used. In addition, the method of forming microlenses is by no means limited to that above mentioned but other methods may be used alternatively for forming the semispherical lenses utilizing surface tension of liquid droplets spouted from an ink-jet head, for example.

For suitably carrying out the reflow steps during the microlens forming process, the ratio of approximately 1 (one) is desirable between the height of, and the spacing between the microlenses.

Figure 7:
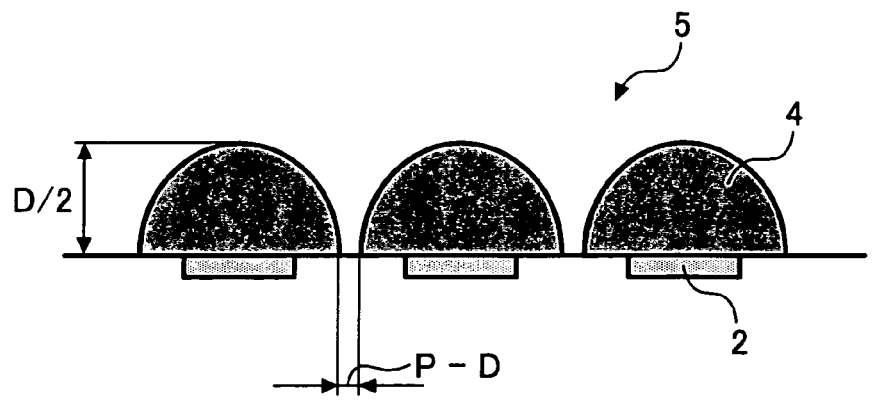
FIG. 7 is a top view diagrammatically illustrating light emitting elements and microlenses formed thereon, in which the relation between the spacing, P-D, and microlens radius is depicted.

Namely, the spacing, P–D, is an important parameter in comparison with the height D/2 as shown in FIG. 7. If the former is smaller than the latter, the processing of the microlenses becomes rather difficult. If the former is larger, in contrast, the diameter D of the microlens 4 is smaller in comparison with the arrangement pitch P, the efficiency in decreasing the radiation angle is reduced. As a result, it is desirable to fulfill the relationship 0.5≦(P–D)/(D/2)≦1.5.

Furthermore, with the following replacement (P–D)/(D/2)=α ... (0.5 ≦α≦1.5),

∴D=2P/(2+α).

As a result, by incorporating light emitting elements which are formed so as to satisfy the relationship $Lmin \leq 2P/(2+\alpha)$, a light emitting array 5 can be provided which is capable of covering the light emitting portion with the microlenses 4 along the shorter side of the assumed rectangular light emitting portion of light emitting element 2, and of being processed with relative ease.

Still in addition, for the light emitting elements satisfying the relationship $L \leq 2P/(2+\alpha)$, the light emitting array 5 provided herein is capable of completely covering the light emitting portion of light emitting elements 2, and of being processed with relative ease.

In the next place, the effect of improvements in transmission efficiency for the optical system disclosed herein will be described along with simulation results on the decrease in the radiation angle obtained with the change of the lengths, Lx and Ly, for the sides of light emitting portion of light emitting element 2 along the x- and y-directions, respectively, and the diameter D of microlens.

There assumed herein are a light emitting array of 1200 dpi, P=21.2 μm, and a far-field pattern of the Lambert distribution.

Figure 8:
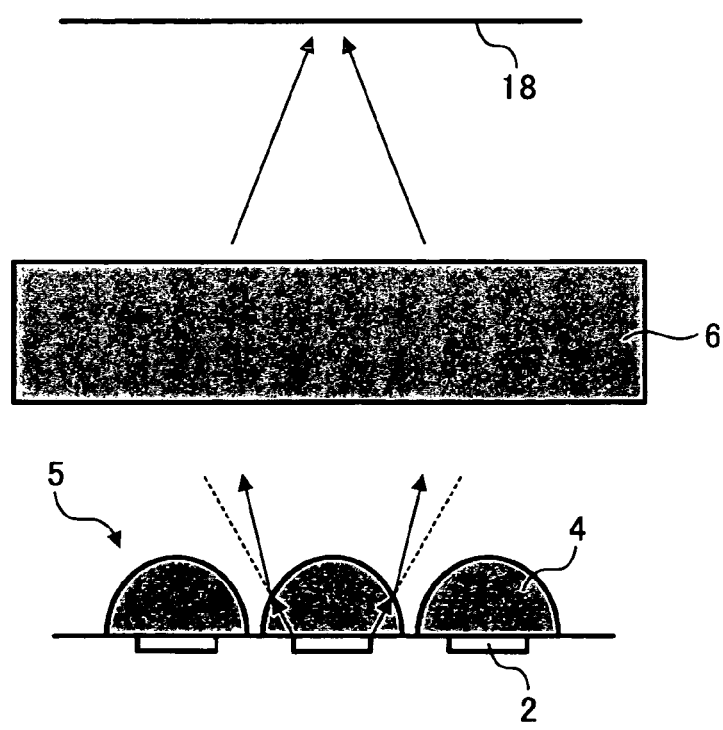
FIG. 8 is a drawing diagrammatically illustrating an including at least an imaging element array consisting of rod lenses according to one embodiment disclosed herein.

In addition, as shown in FIG. 8, an array is formed as an imaging element 6 consisting of rod lenses aligned in a double line being arranged in cross-stitched manner each having an aperture angle of 20 degree.

The light beams emanated from light emitting elements 2 is decreased in the radiant angle and led to be incident on the noted imaging element 6 including rod lenses.

Since the rod lenses included in the rod lens array are each formed having the imaging capability endowed by the refractive-index continuously changing in the radial direction in the rod lens, the image of light emitting elements 2 can be formed by adjusting in predetermined manner the distance from the entrance edge plane to an object, and from the exit edge plane to the surface 18 of an image bearing member as an imaging plane.

Figure 10:
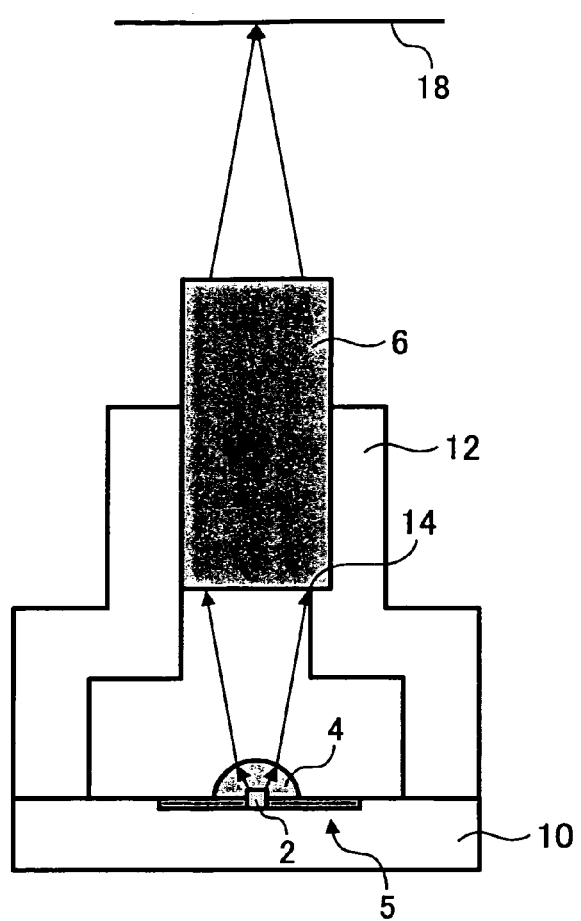
FIG. 10 is a drawing diagrammatically illustrating an optical writing unit incorporating a light emitting array and an rod lens array according to one embodiment disclosed herein.

FIG. 10 illustrates an optical writing unit incorporating the light emitting array and rod lens array each formed as above. Also shown in FIG. 10 are a light emitting array holding member 10, an imaging element array holding member 12, and a stopper 14 for positioning the imaging element 6 in the optical axis direction.

Figure 9:
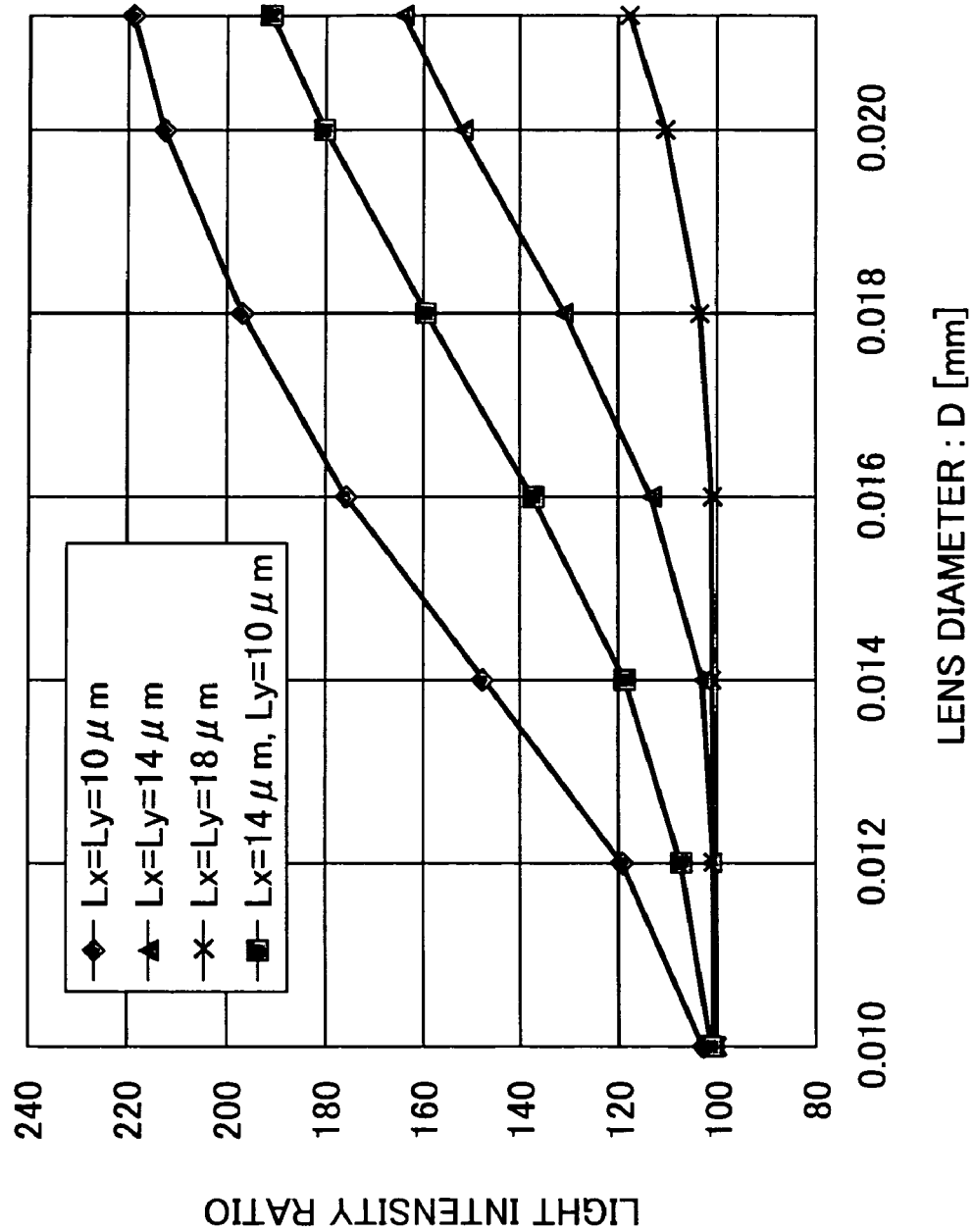
FIG. 9 shows graphical plots of light intensity ratio as a function of microlens diameter according to one embodiment disclosed herein.

In the embodiment disclosed herein above, several results on the light intensity are plotted in FIG. 9. These results have been obtained at a light spot formed on the surface 18 of image bearing member, where the intensity value 100 in the drawing corresponds to the case where no microlens 4 is formed.

For the light emitting element of Lx=Ly=10 μm (Lmin=10 μm, L=14.1 μm), the light intensity ratio is found to increase with increasing lens diameter D departing from Lmin, which is indicative of the effect resulted from the addition of microlenses.

In addition, for the lens diameter D=14.1 μm (i.e., L=D), the ratio of 150 is obtained, which is an improvement by 50%, thereby indicating the noted condition being more favorable for increasing the light intensity.

Still in addition, the relationship is obtained in this case such as $(P-D)/(D/2)=(21.2-14.1)/(14.1/2) \approx 1.0$, which is found fulfilling the noted condition for the processing with relative ease.

Furthermore, the following relationship is also satisfied as $Lmin < L \leq 2P/(2+\alpha) = 0.67P = 14.1$.

In a similar manner, the case of light emitting element of Lx=Ly=14 μm (Lmin=14 μm, L=19.8 μm) is examined. In this case, the light intensity ratio doesn't increase much in the range below D=Lmin. In contrast, the ratio increases with increasing lens diameter D departing from Lmin, which is indicative of the effect resulted from the addition of microlenses.

In addition, for the lens diameter D=19.8 μm (i.e., L=D), the ratio of 150 is obtained, which is an improvement by 50%, thereby indicating the noted condition being more favorable for increasing the light intensity.

The relationship is also obtained in this case such as $(P-D)/(D/2)=(21.2-19.8)/(19.8/2) \approx 0.14$, which is found not fulfilling the noted condition for the processing with relative ease. That is, since the microlens spacing is merely 1.4 μm compared with its 9.9 μm height, which necessitates the processing of a high aspect structure.

In order to obviate this difficulty and to acquire both increased light intensity and excellent workability, D=16.7 μm may be adopted. In such a case, $(P-D)/(D/2)=(21.2-16.7)/(16.7/2) \approx 0.54$, which satisfies the noted condition for the processing with relative ease and yields the ratio of 120, that is an improvement by 20%.

Furthermore, the following relationship is also satisfied as $Lmin < L \leq 2P/(2+\alpha) = 0.79P = 16.7$.

For the light emitting element rectangular in shape of Lx=14 μm and Ly=10 μm (Lmin=10 μm, L=17.2 μm), the light intensity ratio is found to increase with increasing lens diameter D departing from Lmin, which is indicative of the effect resulted from the addition of microlenses.

In addition, for the lens diameter D=16.5 μm, the ratio of 140 is obtained, which is an improvement by 40%, thereby indicating the noted condition being favorable for increasing the light intensity.

Also, the relationship is obtained in this case such as $(P-D)/(D/2)=(21.2 \times 16.6)/(16.6/2) \approx 0.57$.

Furthermore, the following relationship is also satisfied as $Lmin \leq 2P/(2+\alpha) = 0.78P = 16.5$.

For the lens diameter D=14.0 μm, $(P-D)/(D/2)=(21.2-14.0)/(14.0/2) \approx 1.03$, and the ratio of 120 is obtained, which is an improvement by 20%. In addition, the following relationship is also satisfied as $Lmin \leq 2P/(2+\alpha) = 0.66P = 14.0$.

Furthermore, in order to improve workability by decreasing the lens height, D=12.5 μm may be adopted. In such a case, $(P-D)/(D/2)=(21.2-12.5)/(12.5/2) \approx 1.39$, and the ratio of 120 is obtained, which is an improvement by 20%. Optimum conditions can therefore be set in view of both the increase in light intensity and workability.

Furthermore, the following relationship is also satisfied as $Lmin \leq 2P/(2+\alpha) = 0.59P = 12.5$.

In reference to FIGS. 10 and 11, several embodiments of optical writing units will be described herein below incorporating the abovementioned light emitting arrays.

Referring to FIG. 10, an optical writing unit according to one embodiment disclosed herein includes the noted LED array 5, an LDE array holding member 10 for holding the LED array 5, the rod lens array 6, and a rod lens array holding member 12 for holding the rod lens array 6.

The rod lens array 6 is slidably provided so as to be properly positioned in the optical axis direction by a stopper 14 prefabricated inside the rod lens array holding member 12.

In addition, the positioning of both the LDE array holding member 10 and the rod lens array holding member 12 is carried out in a predetermined manner with respect to the plane perpendicular to the optical axis.

Figure 11:
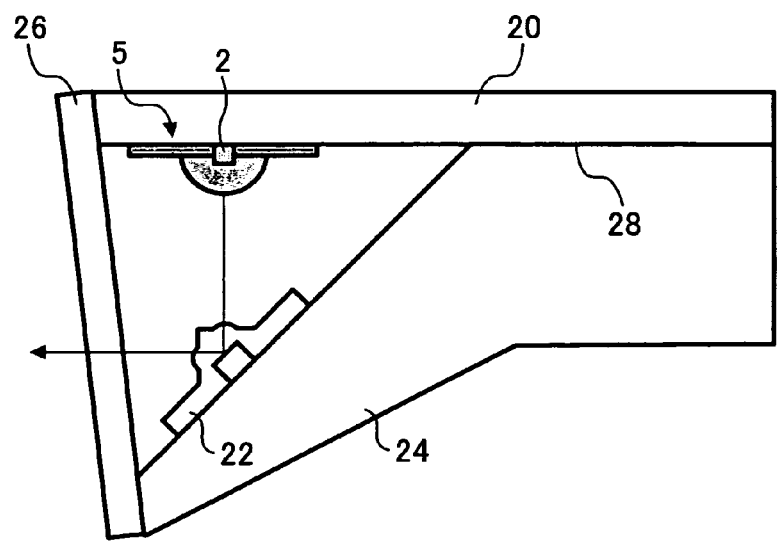
FIG. 11 is a drawing diagrammatically illustrating a further optical writing unit incorporating at least a light emitting array, a roof prism lens array, and a dust-proof glass plate according to another embodiment disclosed herein.

Referring to FIG. 11, a further optical writing unit according to another embodiment disclosed herein includes the noted LED array 5, a further LDE array holding member 20 for holding the LED array 5, a roof prism lens array 22, an imaging element array holding member 24 for holding the roof prism lens array 22, and a dust-proof glass plate 26.

The roof prism lens array 22 is held onto the imaging element array holding member 24 retaining its right-angle construction.

The positioning of the light emitting element 2 of LED and roof prism lens array 22 is achieved both in the direction of optical axis and in the plane perpendicular to the optical axis by the adjustment through sliding movements in the junction face 28 between LDE array holding member 20 and imaging element array holding member 24.

Divergent light beams emanated from light emitting element 2 are decreased in its radiation angle by the microlens 4 and then led to be incident onto the roof prism lens array 22.

The roof prism lens array 22 operates to refract the light beams by a right angle and generate the image of the light emitting element 2 on an image bearing member (not shown) through refraction by its incident and reflecting planes.

Utilized as the imaging optical system herein above are the rod lens array 6 with rod lenses aligned in a double line illustrated in FIG. 10 and the roof prism lens array 22 shown in FIG. 11.

Although imaging optical systems of the array type have been illustrated, the system is not limited to the examples, but similar optical systems of other types may alternatively be used.

In the abovementioned embodiments, the optical systems have been designed consisting of multiple components of respective separate functions such as the microlens 4 primarily for decreasing the radiation angle of light beams emanated from light emitting element 2 and the imaging system primarily for forming spots of the light beams on the image bearing member.

Since the imaging effect from the microlens 4 is relatively small, the processing accuracy required for the microlens 4 is eased to a certain extent, which can offer superior workability.

In addition, the optical characteristics of light beam spots, which are formed by the optical writing unit disclosed herein, can be maintained at the level equivalent to those achieved by previously known imaging systems.

In the next place, a further light emitting array will be described according another embodiment disclosed herein.

FIGS. 12A and 12B illustrate further light source units to be incorporated into the light emitting array, each including at least light emitting elements 31, transparent thin film layer 32, and microlenses 33.

The light source unit is formed including the light emitting element 31 mounted on a light emitting array substrate (not shown), the transparent thin film layers 32 formed thereon covering the light emitting element 31, and the microlens 33 formed further thereon. As shown in FIG. 12A, therefore, the light emitting element 31 and the microlens 33 are integrally formed with intervening transparent thin film layers 32.

The microlens 33 is mounted such that a line segment 34, which passes through the center of light emitting plane of the light emitting element 31 and extending out in the direction perpendicular to the light emitting plane, goes through the center of curvature 35 of the microlens 33 corresponding to the noted light emitting element. The line segment 34 is hereinafter referred to as optical axis 34, and also the direction in parallel to the optical axis 34 is referred to as optical axis direction.

Light beams 36 emanated from the light emitting element 31 are radiated out of the light emitting plane of the element 31 symmetrically diverging with respect to the optical axis 34.

The light beams 36 are refracted by a curved surface of the microlens on passing through. And, as shown in FIG. 12A, the radiation angle decreases for light beams 36 during the passage through the micro lens 33 compared with the angle right after the emission. The density of light beams incident onto imaging optical system can therefore be increased by the passage through the micro lens 33.

As shown in FIG. 12B, however, too large a thickness of transparent thin film layer 32 may cause a decrease in the angle of incoming light beams itself, this result in the decrease in the intensity of light beams passing through the microlens. Therefore, the thickness of the transparent thin film layer 32 needs to suitably be adjusted.

On the other hand, in the case where the rod lens array is used as the imaging optical system, its angle of aperture is generally known to be 20 degree or smaller. As a result, it is preferable at least the angle of 20 degree or larger be maintained as the radiation angle of the light beams passing through the microlens 33.

FIG. 13A illustrates a structure including a light emitting element 31 without the transparent thin film layers 32 and microlenses 33.

Referring to FIG. 13A, light beams 36 emanated from the light emitting element 31 (hereinafter referred to as emerging light beams) are refracted in the direction of an arbitrary angle (θa) with respect to the optical axis.

In contrast, as shown in FIG. 12B, the light source unit disclosed herein additionally includes the transparent thin film layers 32 formed covering the light emitting element 31. As a result, light beams 36 from the light emitting plane 31 are radiated not in the direction of the arbitrary angle (θa) but at a certain angle specified depending on refraction index of the transparent thin film layers 32.

Namely, it turns out light beams 36 from the light emitting plane 31 are refracted in the direction of the angle (θb) as shown in FIG. 13B.

Given a refraction index of N1 for the transparent thin film layers 32, the relationship is obtained between the noted angles, θa and θb, as $$\sin \theta a = N1 \cdot \sin \theta b \tag{1}$$

Assuming θa=20 degree for aperture angle of the noted rod lens array, and N1=1.45 for refraction index of the material SiO$_2$ used herein (for the light emission with wavelength of 760 nm for light emitting element) in the relationship (1), θb is obtained as approximately 14 degree.

Further referring to the relationship (1), with the lens diameter D2 of the microlens 33 as shown in FIG. 13B, the thickness T1 of transparent thin film layers 32 is obtained from the relational expression $$T1 = \frac{D2}{2\tan\left[\sin^{-1}\left(\frac{\sin\theta_a}{N1}\right)\right]}. \quad (2)$$

Assuming the lens diameter D2 of the microlens 33 to be D2=20 μm in the relationship (2), the thickness T1 of transparent thin film layers 32 is obtained as approximately 40 μm.

Accordingly, in order to retain the radiation angle of the emerging light beams 36 to be 20 degree or less, the conditions can suitably fulfilled by using the transparent thin film layer 32 with the thickness T1 of 40 μm and refraction index of 1.45, and the microlens 33 with lens diameter D2=20 μm.

In contrast, in order to realize the radiation angle of the light beams 36 to be 20 degree or larger, the thickness T1 of the transparent thin film layer 32 may be selected smaller than 40 μm.

Therefore, when the radiation angle θa for the emerging light beams 36, the lens diameter D2 of the microlens, and refraction index N1 for the transparent thin film layers 32 are given, the thickness T1 required to the transparent thin film layers can be obtained from the relational expression (2).

Incidentally, the values of index refraction of the materials in use for forming transparent thin film layers 32 ranges in general from 1.40 to 1.70. In addition, it is evident from the relationship (2) that the thickness Ti of transparent thin film layer decreases with increasing the refraction index N1.

By assuming the refraction index N1 1.40 for transparent thin film layer 32, and the radiation angle θa=20 degree for emerging beams from light emitting element 31, the relationship (2) is made simpler to obtain the expression $$Ti \leq 2 \cdot D2. \quad (3)$$

As a result, by adjusting the thickness T1 of transparent thin film layer 32 and the lens diameter D2 of microlens so as to fulfill the relationship (3), necessary and sufficient light intensity can be provided to an imaging optical system with an aperture angle of 20 degrees or smaller.

In the case where the refraction angle of emerging light beams required to the imaging optical system is 20 degree or larger, the upper limit of the thickness Ti of transparent thin film layer 32 can be obtained from the relational expression $$T1 < \frac{D2}{2\tan\left[\sin^{-1}\left(\frac{\sin\theta_a}{N1}\right)\right]}, \quad (4)$$

where D2 is the lens diameter of the microlens and N1 refraction index for the transparent thin film layer 32, as mentioned earlier.

In the next place, the shape of microlens will be examined herein below, that is suitable for decreasing radiation angle of light beams emanated from the light source unit.

As described earlier, the light beams 36 are refracted by microlens 33 on passing through and radiation angle of the beams decreases.

However, in the case shown in FIG. 14A where a microlens 33 is placed such that its center of curvature 35 is positioned further away of a light emitting element 31 viewed from the surface of the microlens 33, light beams emergent from the light emitting element 31 are not converged but refracted to be divergent on passing through the microlens 33.

That is to say, even if emergent light beams having radiation angle of 20 degree are emanated from the light emitting element 31, light beams are refracted in the divergent direction, and light beams incident on an imaging optical system (not shown) become divergent to a degree larger than the aperture angle of an optical system (not shown).

As a result, the intensity of light beams incident on the imaging optical system decreases so that light intensity necessary and sufficient for the optical system cannot be reached.

In order to obviate the abovementioned difficulty, it is necessary for a microlens 33, as shown in FIG. 14B, to be placed such that its center of curvature 35 is positioned closer to a light emitting element 31 viewed from the surface of the microlens 33.

Even taking the use of a microlens 33 having the semispherical structure into consideration, it is preferred the center of curvature 35 is positioned within thickness of transparent thin film layers 32, that is, between the light emitting plane of the light emitting element 31 and the microlens 33.

In addition, since two neighboring microlenses 33 and 34 are interconnected by transparent thin film layer 32, light beams 36 emerging from an arbitrary light emitting element may pass through the microlens 33 which is provided opposing to the emitting element 31 neighboring thereto.

Such emergent light beams 36 going through the neighboring microlens 33 may be focused on an unintended location as a spot which is called ghost light.

The ghost light arises when the radiation angle of light beams 36 emerging from an arbitrary light emitting element 31 becomes smaller than the aperture angle of imaging optical system on passing through the microlens 33 opposing to the neighboring emitting element 31.

This process will be described herein below in reference to FIGS. 15A and 15B.

Figure 15A:
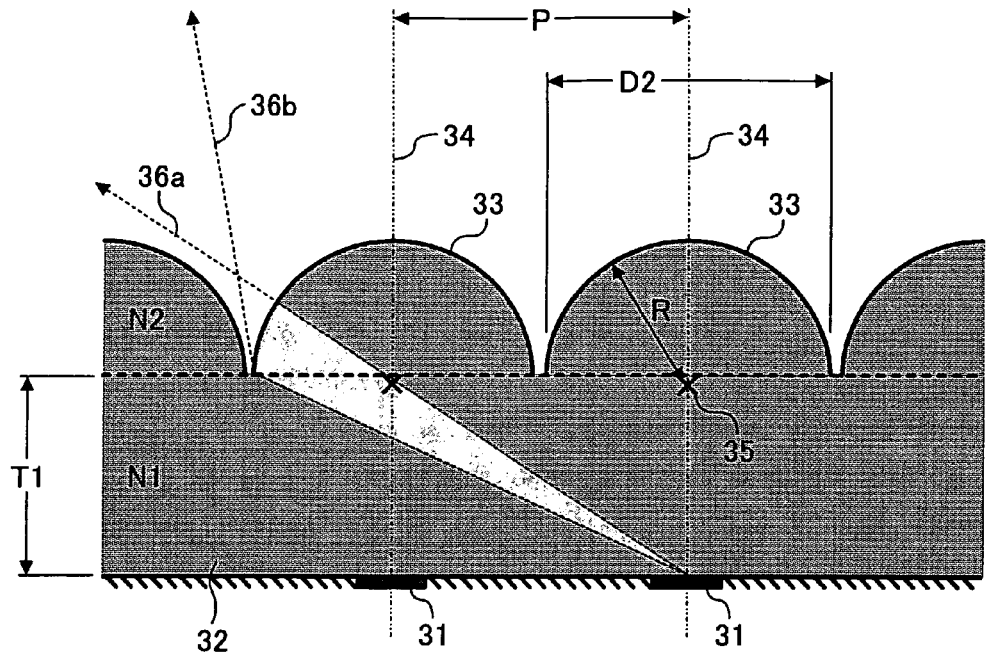
FIG. 15A is a side view illustrating a light source unit according to still another embodiment disclosed herein, in which the angle between the optical axis and the line segment, which connects the center of a light emitting plane of an arbitrary light emitting element and the center of curvature of the neighboring microlens, is larger than the aperture angle of imaging optical system.

Referring now to FIG. 15A, if the angle between the optical axis 34 and the line segment 36a, which connects the center of a light emitting plane of an arbitrary light emitting element 31 and the center of curvature 35 of the neighboring microlens 33, is larger than the aperture angle of imaging optical system, the light beams along the line segment advances without being refracted by the curved face of the microlens 33 and without being incident on the imaging optical system.

In the present case, given D2 the lens diameter and R the radius of curvature for the microlens 33, P an alignment pitch of the light emitting elements 31, and Ti the thickness of transparent thin film layers 32, the angle between the straight line and the optical axis 34 is obtained as $$\theta_A = \tan^{-1}\left[\frac{P}{T1 - \sqrt{R^2 - (D2/2)^2}}\right]. \quad (5)$$

In contrast, emerging light beams 36, which are advancing within the range of direction between the straight line 36a and a further straight line 36b, are refracted by the curved face of microlens 33 such that the radiation angle is decreased.

As a result, the resulting beams become incident onto the imaging optical system (not shown) and the ghost light appears.

Although the ghost light is small in its intensity, the appearance thereof is preferably alleviated since this may form a light spot on the image forming surface.

By forming the structure, therefore, such that the angle between the straight line 36a and the optical axis 34 is at least twice the aperture angle of imaging optical system (not shown), the intensity can be decreased effectively of the light beams which are directed within the range of angle between the straight lines, 36a and 36b, and which may cause the ghost light.

As a result, the magnitude of ghost light on the image forming surface can be decreased to a level almost negligible for suitable image formation.

The result of the above noted examination is reflected to the relational expression $$\theta_A \geq 2 \cdot \tan^{-1}\left[\frac{P}{T1 - \sqrt{R^2 - (D2/2)^2}}\right]. \quad (6)$$

As seen from the relationship (6) and FIG. 15A, therefore, undesirable ghost light can be alleviated by adjusting the lens diameter D2 of, and the radius of curvature R of the microlens 33, the alignment pitch P of the light emitting elements 31, and the thickness T1 of transparent thin film layers 32, such that the angle between the optical axis 34 and the line segment 36a, which connects the center of a light emitting plane of an arbitrary light emitting element 31 and the center of curvature 35 of the neighboring microlens 33, is at least twice the aperture angle of imaging optical system (not shown).

However, in the case where the length of the light emitting element 31 in the direction of arrangement is at least one half the radius of the microlens 33, there is still room for improvement even after fulfilling the above noted relationship.

Namely, in the case described above where the length of the light emitting element 31 in the arrangement direction is sufficiently small, or at most one half the radius of the microlens 33, the ghost light can be suppressed under the conditions dictated by the relationship (6).

Figure 15B:
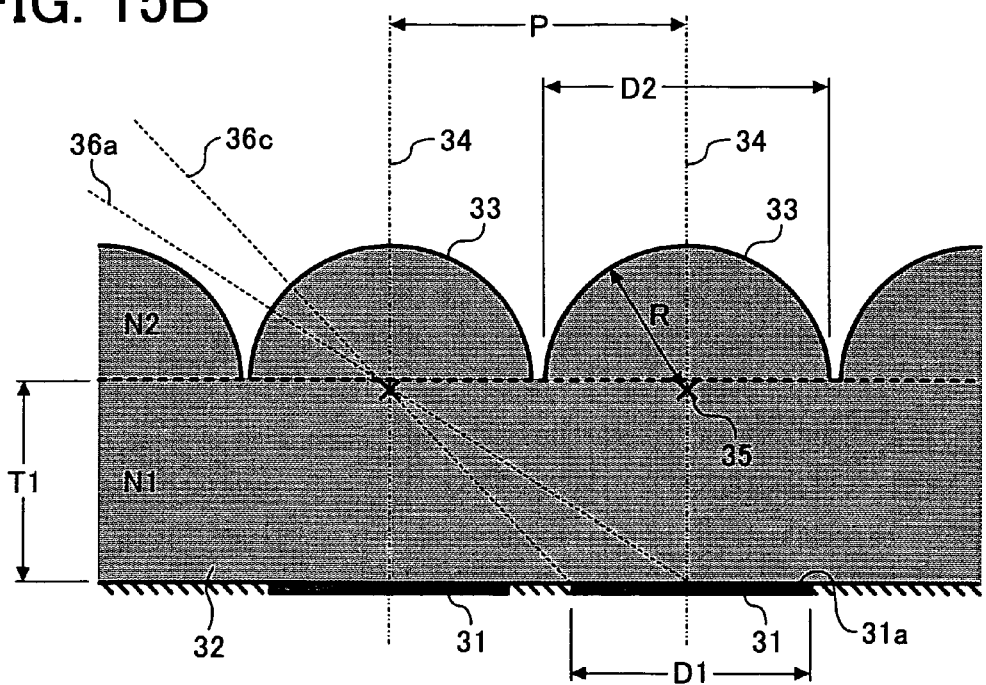
FIG. 15B is a side view illustrating a light source unit similar to that of FIG. 15A, in which the length of the light emitting element in the arrangement direction is larger.

However, in the case such as shown in FIG. 15B, there undergoes a considerable change in the angle between the straight line 36a, which connects the center of a light emitting plane of an arbitrary light emitting element 31 and the center of curvature 35 of the neighboring microlens 33, and another straight line 36a, which connects the edge of light emitting plane 31a of the light emitting element 31 and the center of curvature 35 of the neighboring microlens 33. As a result, above conditions turns out insufficient.

Therefore, when the length of the light emitting element 31 in the arrangement direction is at least one half the radius of the microlens 33, by forming the structure such that the angle between the straight line 36c and the optical axis 34 is at least twice the aperture angle of imaging optical system (not shown), the effect can be acquired similar to that obtained earlier in the case where the length of the light emitting plane 31a is small compared to the diameter of the microlens 33.

After taking these factors into consideration, the range of angle to be adjusted is obtained as follows with given D1 the length of the light emitting element 31 in the arrangement direction $$\theta_C \geq 2 \cdot \tan^{-1}\left[\frac{P - D1}{T1 - \sqrt{R^2 - (D2/2)^2}}\right] \quad (7)$$

The length of the light emitting plane 31a of light emitting element 31 in relationship (7) may be taken as that obtained from the measurement of actually produced emitting elements. It may alternatively be obtained from the results on light emission intensity ratio of the light emitting element 31.

The intensity distribution of light emitted from light emitting plane 31a is known in general to be most intense at the portion of light emitting plane 31a in the vicinity of electrodes in contact therewith and to gradually decrease departing therefrom. As a result, effective light emission length can be defined for the light emitting plane 31a utilizing an arbitrary intensity ratio suitably selected as a threshold with respect to a peak emission intensity.

As an example, the location on the light emitting plane 31a corresponding to the $1/e^2$ intensity of the peak value can be taken as the edge of interest presently.

Figure 16A:
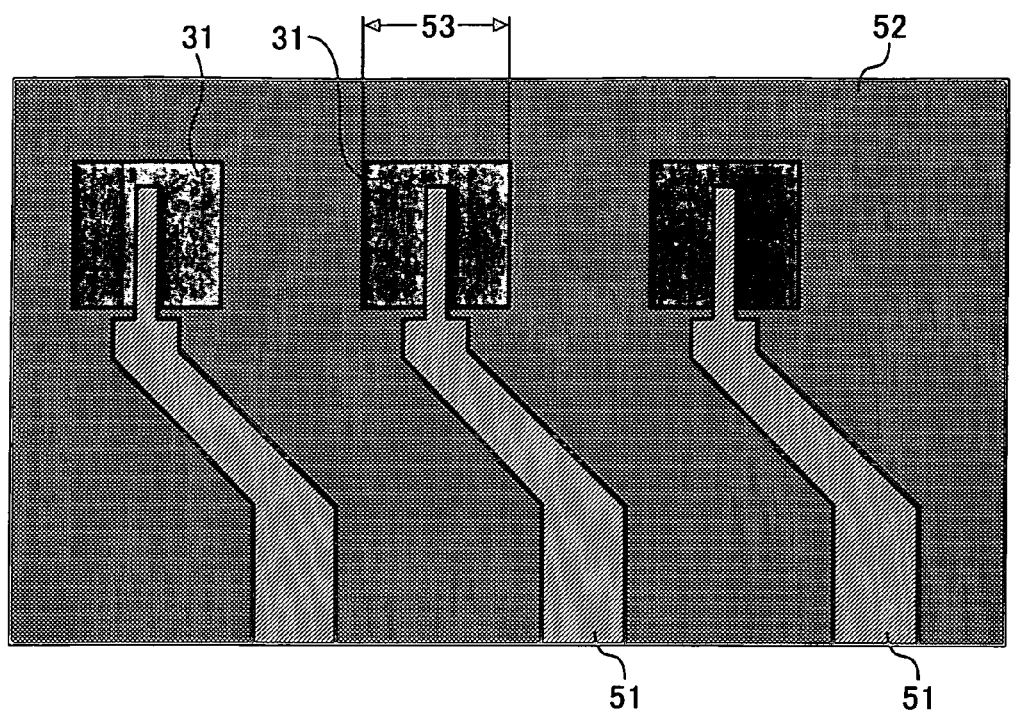
FIG. 16A is a drawing generally illustrating light emitting elements and electrodes provided in contact therewith, in which the electrodes are provided to penetrate into the middle portion of the elements.
Figure 16B:
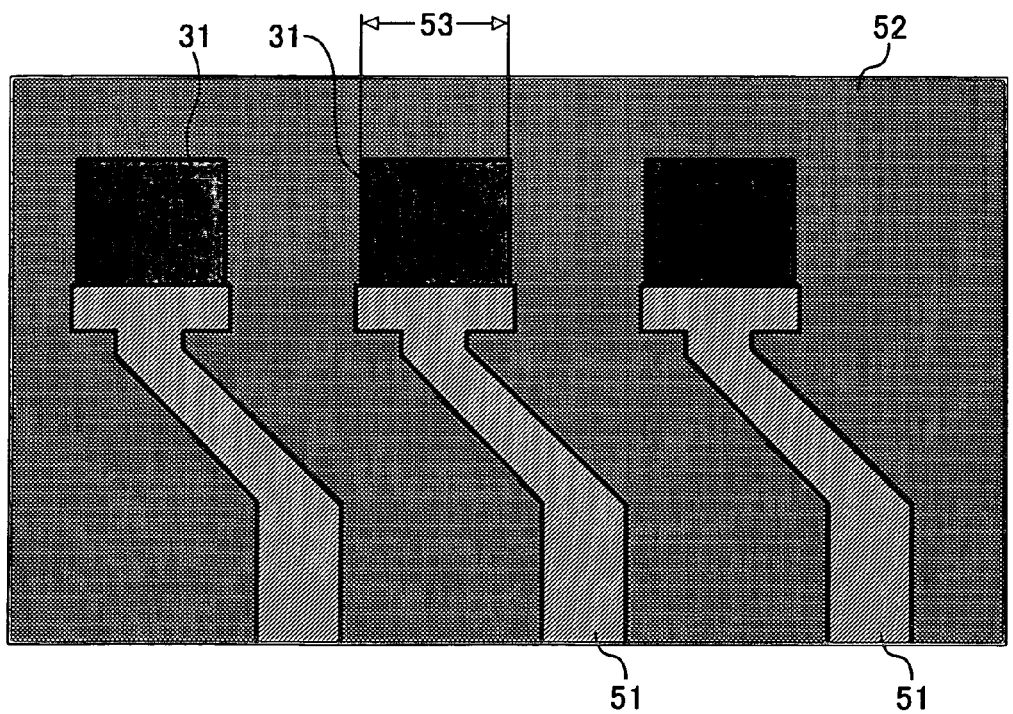
FIG. 16B is a drawing illustrating light emitting elements and electrodes provided in contact therewith, in which the electrodes are formed to be attached to one of the sides.

FIGS. 16A and 16B illustrate light emitting elements 31 and electrodes 51 provided in contact therewith. The light emitting elements 31 are mounted on a light emitting array substrate 52 at a constant interval and connected by electrodes 51 for supplying power thereto.

FIG. 16A shows an illustration of light emitting elements 31 and electrodes 51 connected thereto, in which the electrodes 51 are provided so as to penetrate into the middle portion of the elements 31. Similarly, FIG. 16B shows another illustration of the light emitting elements 31 and electrodes 51, in which the electrodes 51 are provided so as to be attached to one of the sides having the length of at least that of the sides. It may be added that the relationship (7) holds for both cases of FIGS. 16A and 16B.

The light source units described hereinabove have the structure provided with a plurality of microlenses interconnected by an underlying transparent thin film layer.

Because of presence of the transparent layer, light beams may arise which are transmitted there through, do not pass through the microlenses, and are incident onto an imaging optical system. As a result, these light beams may give rise to undesirable effects on the spots formed on an imaging surface.

Although any focused image isn't formed from the light beams in contrast to the ghost light noted earlier, these light beams may be irradiated over a certain area on the imaging surface, which is generally called light flare and which causes undesirable effects on proper image formation.

Therefore, in order to alleviate the light flare, it is necessary for the surface areas other than the faces of microlenses to be coated with film layers opaque at the emission wavelength of the light emitting element currently utilized.

As the method for coating such opaque layers, several known methods may be adopted such as, for example, one capable of coating selectively on area portions other than the faces of microlenses using a nozzle device similar to that in use for inkjet printing, or another using opaque photoresist material which may be once coated over the structure and then subjected to etching removal steps to remove layer portions overlying the faces of microlenses.

Furthermore, light reflection from the interface is examined. At the interface between the transparent thin film layer 32 and microlens 33, as shown in FIG. 17A, light reflection from this interface can be alleviated by bringing refractive index to be equal to each other, i.e., the refractive index N1 of the former is equal to that of the latter N2.

As a result, the decrease in light intensity possibly caused by the reflection from the interface can be alleviated for the light beams emerging from transparent thin film layer 32 and incident to microlens 33, which is advantageous for light intensity of the light source unit to increase.

Figure 17A:
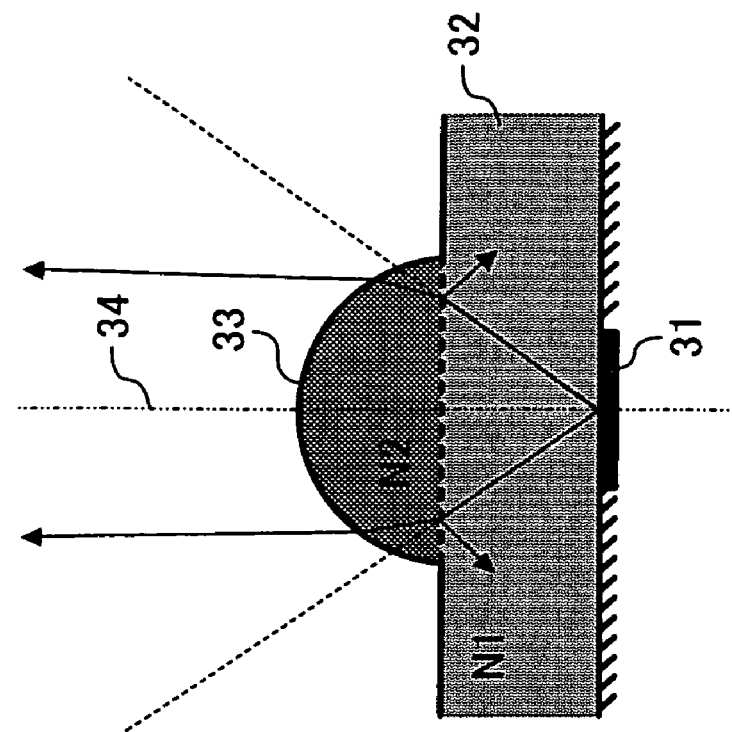
FIG. 17A is a side view illustrating a light source unit including at least a light emitting element, a transparent thin film layer, and microlens according to still another embodiment disclosed herein, in which light reflection from the interface between the transparent thin film layer and microlens can be alleviated by bringing refractive index to be equal to each other at the interface.
Figure 17B:
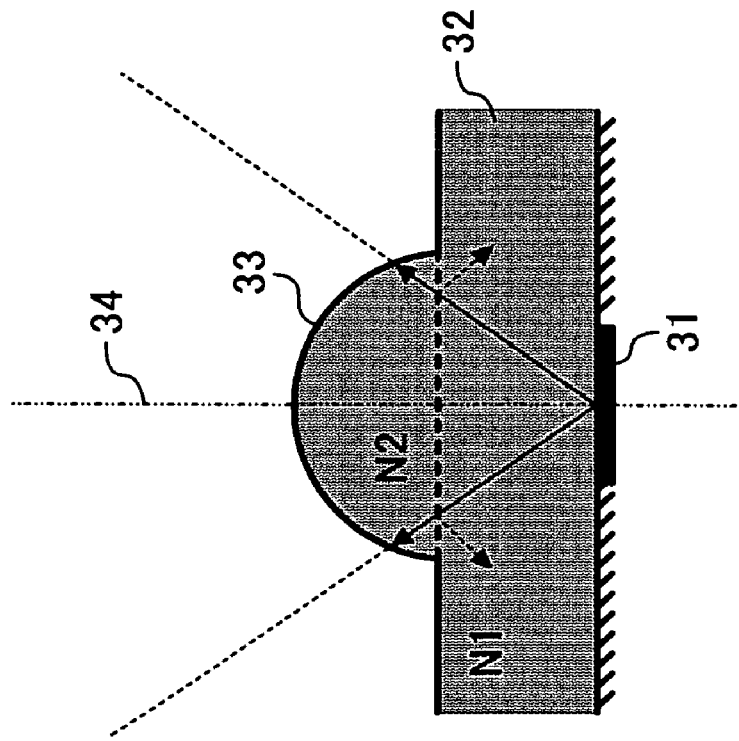
FIG. 17B is a side view illustrating the light source unit similar to that of FIG. 17A, in which the refractive index of the transparent thin film layer is smaller than microlens so as more beams be taken into within radiation angle of the imaging optical system.

In contrast to the case of FIG. 17A, there shown in FIG. 17B is the case of an interface, in which the refractive index N1 of transparent thin film layer 32 is made smaller than N2 of microlens 33. Since light beams in this case emerging from transparent thin film layer 32 and incident to microlens 33 are refracted to be convergent, this structure is advantageous for radiation angle of emerging light beams to decrease.

As a result, it becomes feasible for more beams to be taken into within radiation angle of the imaging optical system (not shown).

The transparent thin film layers 32 disclosed herein above may be formed by several methods known in semiconductor processing. For example, silicon oxide ($SiO_2$) layers can be deposited with relative ease by CVD (chemical vapor deposition) method or LPE (liquid phase epitaxial) method.

These layers may be formed alternatively by other methods utilizing solvent coating such as, for example, spin coating or spray coating method. Since the value of refractive index is different depending on the kind of the solvent, the index of transparent thin film layers 32 may arbitrary be adjusted by suitably selecting the solvent.

In addition, by using low refractive index material recently developed as exemplified by porous film, for example, the transparent thin film layers 32 can be formed to have a large difference in refractive index from the microlenses.

As to the method of forming the microlenses disclosed herein, one for coating photoresist material is cited. In this method, a photoresist material, which transparent with respect to light beams in the emission wavelength range of the light emitting element, is first coated by spin or spray coating technique, and the portions to be disused in forming the microlenses are removed by known etching process steps. The microlenses are subsequently formed by the reflow technique.

The light emitting arrays described herein above in reference to FIGS. 12 through 17 are suitably combined with the roof prism lens array noted earlier to be incorporated into the optical writing unit of FIG. 18.

Figure 18:
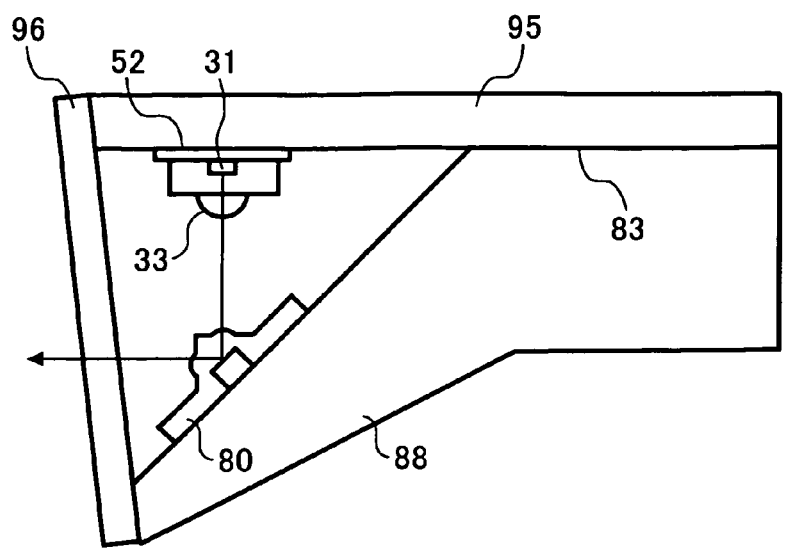
FIG. 18 is a side view diagrammatically illustrating an optical writing unit according to another embodiment disclosed herein with the light emitting array described herein combined with a roof prism lens array.

As shown in FIG. 18, the optical writing unit includes at least LEDs as light emitting elements 31, which are mounted on LED array substrate 52 with each light emitting plane facing downward.

The roof prism lens array is held on an imaging element array holding member 88 to be situated at the location opposing to the light emitting element 31 with a predetermined angle.

In addition, LDE array holding member 95 for holding the LED array substrate 52 and the imaging element array holding member 88 are integrally held through sliding movements in a junction portion 83. Furthermore, a dust-proof glass plate 96 is provided over the opening between the LDE array holding member 95 and imaging element array holding member 88 to serve as a structure for keeping unwanted materials away from entering there into.

Light beams emanated from light emitting element 31 transmit through a microlens 33 and then led to be incident onto the lens on the entrance side 81. The thus incident beams reflected to the direction normal to the incidence, go through the exit side lens 82, and irradiated onto an image bearing member (not shown).

Although the embodiment has just been illustrated using the roof prism lens array, an imaging optical system is not necessarily of the array-type but other similar optical system may alternatively used.

The light emitting arrays disclosed herein above may be combined also with the rod lens array noted earlier to be incorporated into the optical writing unit of FIG. 19.

Figure 19:
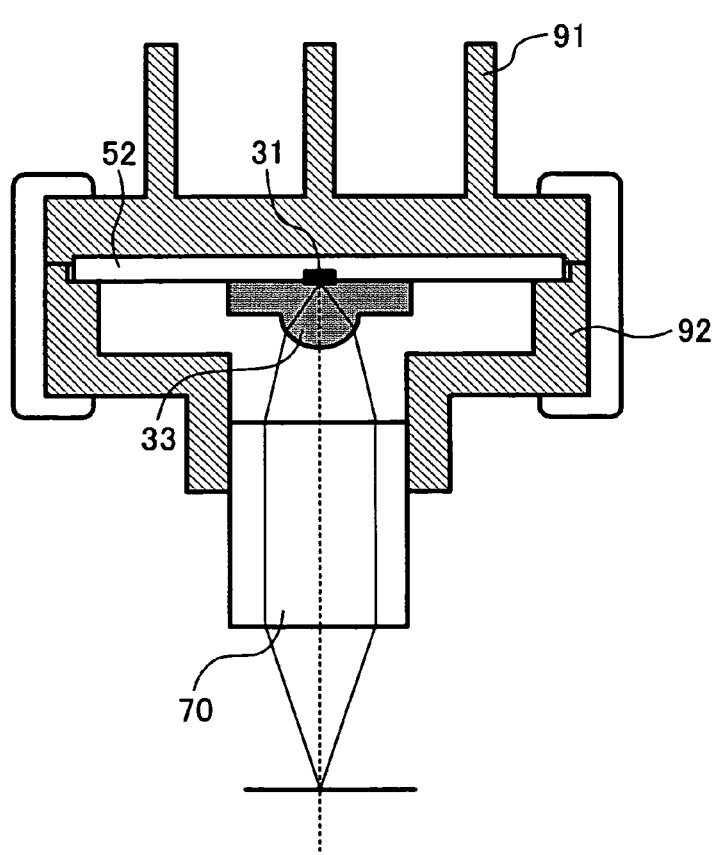
FIG. 19 is a drawing diagrammatically illustrating an optical writing unit incorporating an LED array and an rod lens array according to another embodiment disclosed herein, in which an LED array substrate is further provided in contact with a heat sink.

Referring now to FIG. 19, this optical writing unit includes at least LEDs as light emitting elements 31, which are mounted on LED array substrate 52. The LED array substrate 52 is, in turn, provided in contact with a heat sink 91.

Figure 24A:
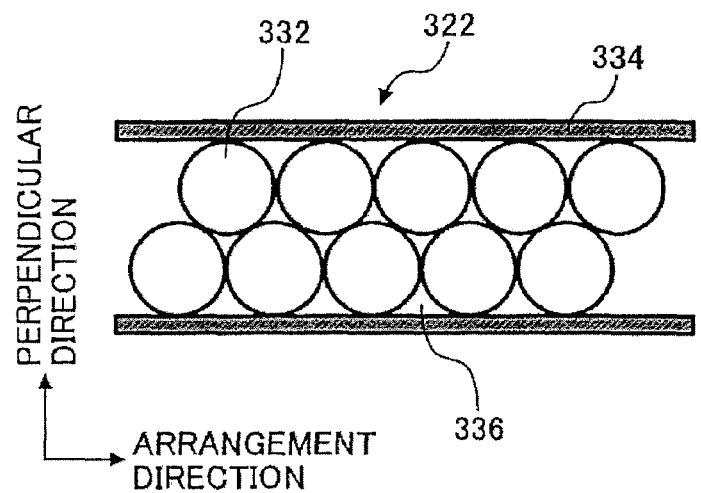
FIG. 24A is a diagrammatical view illustrating a known rod lens array in use for an optical writing unit, in which rod lenses are aligned in a double line each piled in staggered position and held altogether between two opposing side plates.
Figure 24B:
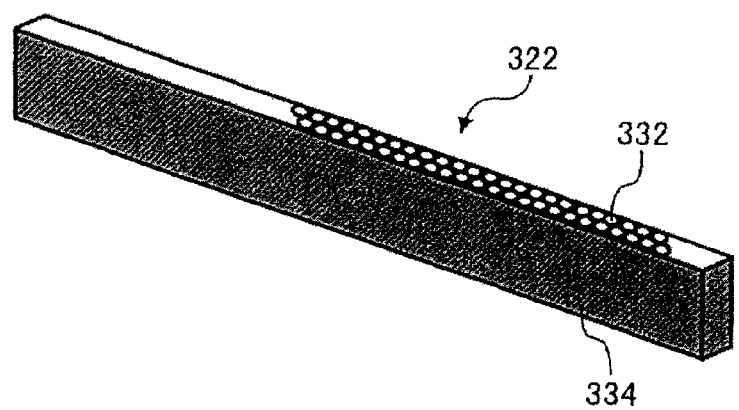
FIG. 24B is a perspective view of the rod lens array of FIG. 24A.
Figure 25:
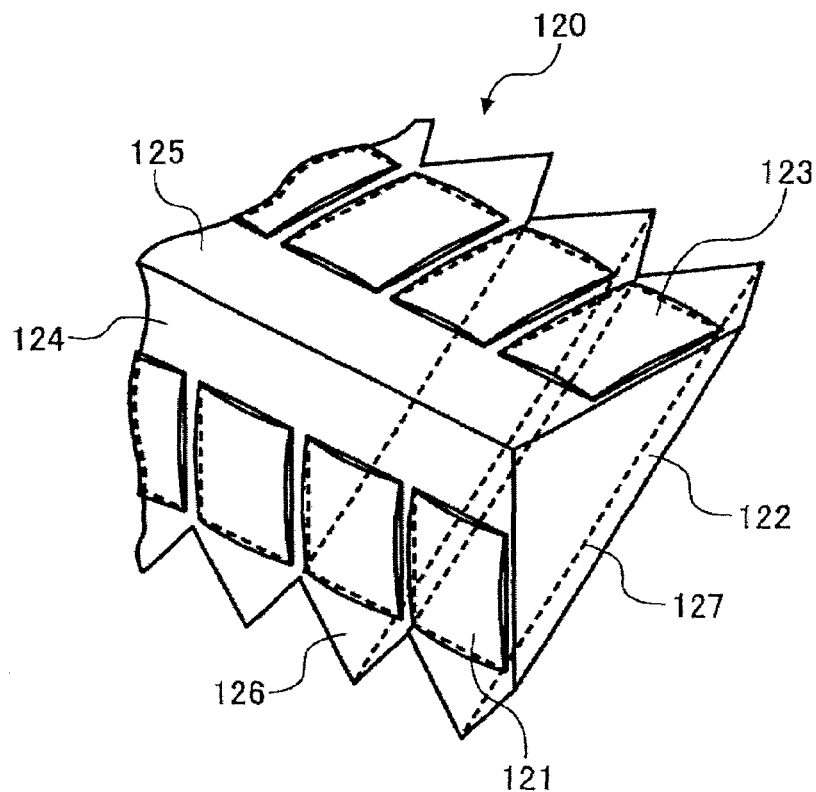
FIG. 25 is a perspective view illustrating a known roof prism lens array in use for an optical writing unit.
Figure 26:
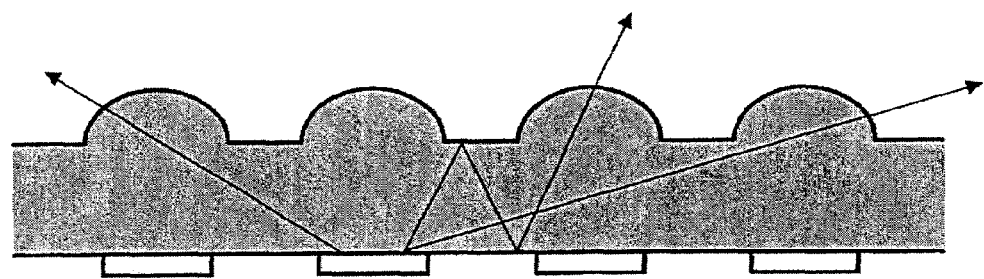
FIG. 26 is a drawing for illustrating the modes of transmission of the light flare.

As an imaging optical system included in the optical writing unit, a rod lens array 70 is used herein, which are formed of rod lenses aligned in a double line each piled in staggered position, as described earlier in reference to FIG. 24. Since it is necessary for both fixed microlens 33 and the rod lens array 70 to be held while retaining a proper distance from the light emitting element with an intervening transparent thin film layer, the structure is formed integrally having spatial relation fixed by a housing 92.

Light beams emergent from light emitting element 31 transmit through the microlens 33 and then microlens, and are irradiated onto an image bearing member (not shown) such as a photoreceptor drum.

In reference to FIG. 20, an embodiment of an image forming apparatus incorporating the abovementioned optical writing units will be described herein below. In the following, brief description, electrophotographic process is primarily concerned as an example of the image forming process.

Figure 20:
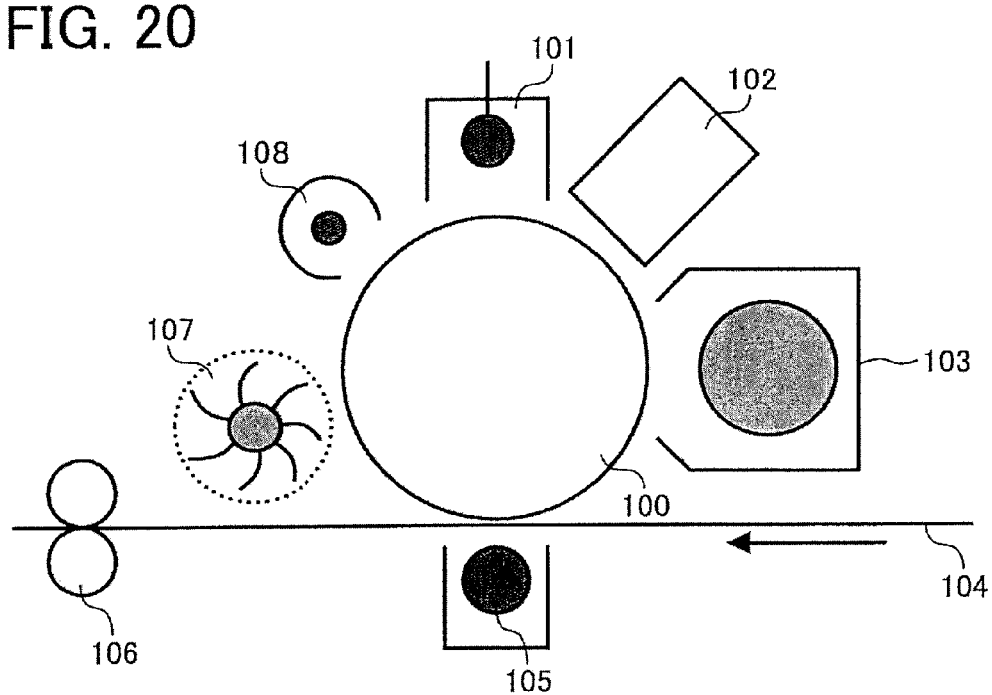
FIG. 20 is a diagrammatical view illustrating an image forming apparatus incorporating optical writing units according to another embodiment disclosed herein.
Figure 21:
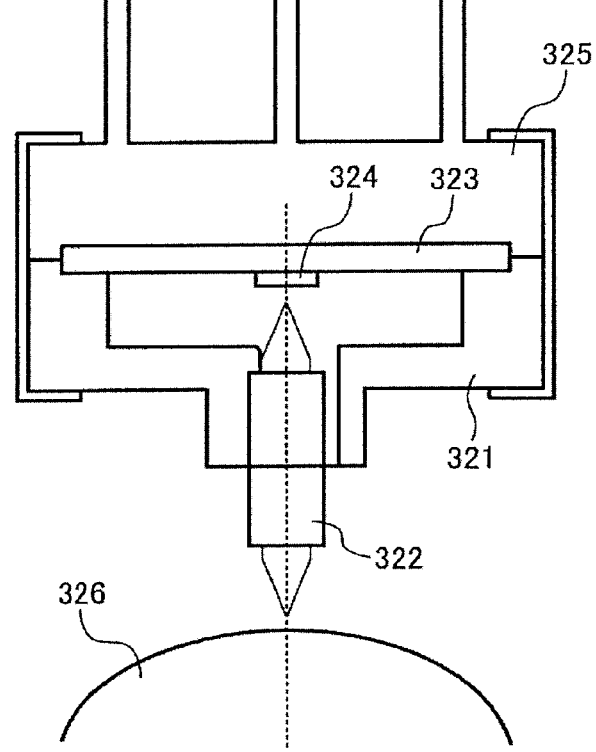
FIG. 21 is a drawing diagrammatically illustrating a known optical writing unit incorporating a light emitting array and a rod lens array.
Figure 22A:
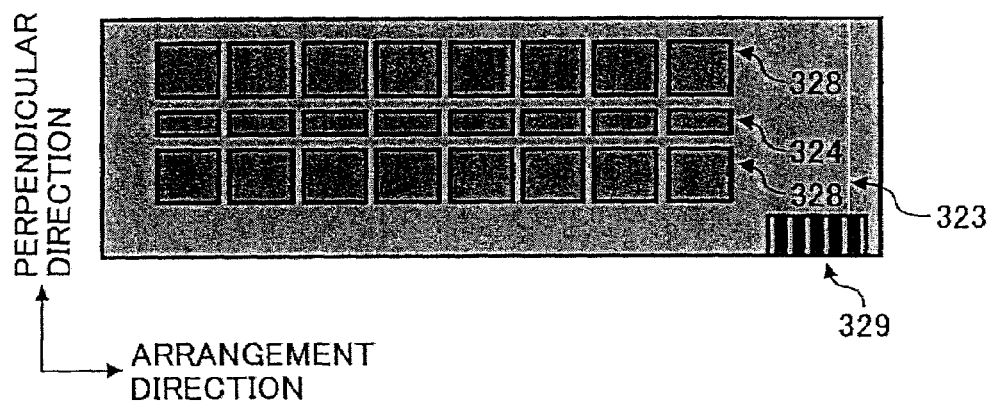
FIG. 22A is a top view illustrating a known LED array in use for an optical writing unit.
Figure 22B:
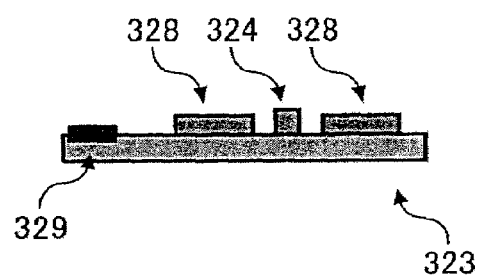
FIG. 22B is a side view of the LED array of FIG. 22A.
Figure 23:
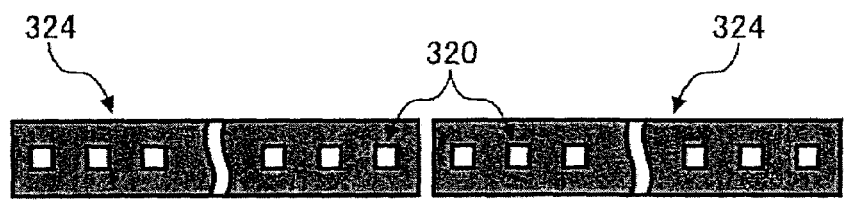
FIG. 23 is a top view diagrammatically illustrating LED array chips consisting of a known light emitting array.

Referring now to FIG. 20, the image forming apparatus includes several units for implementing electrophotographic process steps provided on the periphery of an image bearing member 100 such as, for example, a photoreceptor drum.

These units on the periphery are each arranged successively along the direction of rotation of image bearing member 100, starting with a charging unit 101 which serves to charge the surface of the image bearing member 100 to a relatively high substantially uniform potential.

An optical writing unit 102 (which may alternatively be called exposure unit) is provided next. As the optical writing unit, any one of the writing units disclosed herein is suitably utilized.

Further arranged on the periphery are a development unit 103 for forming toner images by adhering toner particles onto latent images formed on the surface of image bearing member 100, a transfer unit 105 for transferring the toner images formed on the surface of image bearing member 100 to a copy sheet, a cleaner unit 107 for cleaning toner particles residual on the image bearing member 100, and a discharging unit 108 for removing remaining charged portions remaining on the image bearing member 100.

In addition, a fixing unit 106 is provided at the end of conveying path of the copy sheet for permanently affixing the transferred toner images by applying pressure and heat onto the copy sheet.

The thus provided process cycle consisting from charging through discharging process steps can complete the image formation.

Although the exemplary system and unit are described herein above on the mono-color image formation, this is not intended to be limiting but the system and unit can also be adapted to color image formation as well, which is implemented by overlaying multiple color images.

In this case, one optical writing unit may be utilized in an image forming apparatus for multiple colors in common for the image formation. Namely, the apparatus is provided with this optical writing unit and a image bearing member, in which, one color at a time, image signals of a first color are optically written, developed with toner particles of corresponding color, transferred to a copy sheet, and subsequently for a second color, and so forth, altogether to be superimposed successively to result a full color image copy.

Alternatively, the image forming apparatus may be provided with a plurality of optical writing units and image bearing members each for respective colors, so called the tandem-type writing units, in which image signals of respective colors are optically written into corresponding image bearing members, developed with toner particles of corresponding colors, and transferred successively to a copy sheet being superimposed properly to result in a full color image copy.

The image forming apparatus with tandem-type construction is therefore advantageous to high speed optical writing and image formation.

According to present invention, therefore, a light emitting array can be provided having reduced light energy loss during the transmission to a photoreceptor, which is suitably adapted to the use in optical writing unit. In addition, an image forming apparatus can be provided incorporating the optical writing unit having higher imaging speeds and excellent imaging capabilities.

Namely, the light emitting array disclosed herein is provided including at least a plurality of light emitting elements, each of which is provided thereon with a microlens in one-to-one correspondence, in which the microlens is hemispherical in shape and separated from a microlens neighboring thereto.

In addition, the light emitting portion of the light emitting element is provided having a shape of a rectangle and formed so as to satisfy the relational expression, $Lmin \leq D \leq P$, or alternatively the relation, $Lmin \leq 2P/(2+\alpha)$, assuming $(P-D)/(D/2)=\alpha (0.5 \leq \alpha \leq 1.5)$, where Lmin is the length of the shorter side of the rectangle, P the alignment pitch of the light emitting elements, and D the diameter of the microlens As a result, the light emitting array provided herein is capable of completely covering the light emitting portion of light emitting elements suitable for reducing radiation angle effectively, and of achieving process steps for forming of relative ease, at the same time.

In addition, the light emitting array disclosed herein is formed with light emitting elements each having far-field emission angle characteristics of Lambert distribution. This use of relatively less expensive light emitting elements is advantageous to cost reduction.

The microlens included in the light emitting array may be formed of a transparent photoresist material on the light emitting elements formed in advance on a wafer. Since the light emitting array may be diced out of the wafer after the formation, this method is advantageous to mass production. In addition, the use of conventional photoresist material is advantageous to the formation of microlenses and the array units without adopting complicated manufacturing process with reduced costs.

In another aspect, the light source unit disclosed herein is provided including a light emitting array comprising a plurality of light emitting elements formed in line, a transparent thin film layer formed on the light emitting array by laminating a material substantially transparent at an emission wavelength of light emitting elements, and a plurality of microlenses formed on the transparent thin film layer to be in one-to-one correspondence to the plurality of light emitting elements, in which the light source unit is formed so as to satisfy the relational expression, $T1 \leq 2 \cdot D2$, where T1 is the thickness of transparent thin film layer and D2 the diameter of each microlens.

In addition, the light source unit is formed such that the center of curvature of each of the microlenses is situated between a light emitting plane of each of the light emitting elements and each of the microlenses opposing to the light emitting plane.

As a result, it becomes feasible for the light beams emanated from the light emitting elements to be brought into a range suitable for the aperture angle of the microlens and for the light intensity sufficient to the imaging optical system to be attained.

A film layer opaque at an emission wavelength of the light emitting elements may further be provided in forming the light source unit for light shielding on the surface area other than an effective area of curved surfaces of the plurality of microlenses. By thus alleviating light flare during the transmission of light beams in the light source unit, beam spots for image forming can be irradiated onto image bearing member with excellent optical characteristics.

Furthermore, the light emitting elements included in the light source unit may be provided each with LEDs of the self-scanning type, by which the light intensity sufficient to the imaging optical system can be obtained.

In still another aspect, the optical writing unit disclosed herein may be formed incorporating any one of the above mentioned light emitting arrays.

For example, the light source unit disclosed herein is provided including a plurality of light emitting elements and an imaging optical system configured to form images of the plurality of light emitting elements, in which each of the elements is provided thereon with a microlens in one-to-one correspondence, and the microlens is hemispherical in shape and separated from a further microlens neighboring thereto.

This may result in the increase in light transmission efficiency of the optical system and in stable light spots for the optical writing unit disclosed herein.

Alternatively, the light source unit disclosed herein is provided including a light source unit comprising a plurality of light emitting elements and an imaging optical system configured to form images of the plurality of light emitting elements, in which the emitting elements each may have far-field emission angle characteristics of Lambert distribution.

Alternatively still, the optical writing unit is provided including a light source unit comprising a plurality of light emitting elements, and an imaging optical system configured to form images of the plurality of light emitting elements, in which the light source unit further includes a transparent thin film layer which is formed on the plurality of light emitting elements by laminating a material substantially transparent at an emission wavelength of the light emitting elements, and a plurality of microlenses which are formed on the transparent thin film layer to be in one-to-one correspondence to the plurality of light emitting elements.

Alternatively, the optical writing unit is provided including a light source unit comprising a plurality of light emitting elements, and an imaging optical system configured to form images of the plurality of light emitting elements, in which the light emitting elements are each self-scanning type LEDs.

Alternatively, the optical writing unit is provided including a light source unit, and an imaging optical system configured to form images of a plurality of light emitting elements.

In addition, the light source unit includes herein a light emitting array comprising the plurality of light emitting elements formed in line, a transparent thin film layer formed on the light emitting array by laminating a material substantially transparent at an emission wavelength of the light emitting elements, and a plurality of microlenses formed on the transparent thin film layer to be in one-to-one correspondence to the plurality of light emitting elements.

Still in addition, the light source unit is formed through adjustment of the lens diameter of, and the radius of curvature of the microlens, the alignment pitch of light emitting elements, and the thickness of the transparent thin film layer such that the angle between the optical axis and a line segment, which connects the center of light emitting plane of an arbitrary light emitting element and the center of curvature of a neighboring microlens, is at least twice the aperture angle of the imaging optical system.

Since the noted angle between the optical axis and line segment is adjusted to be equal to, or larger than, twice the aperture angle of the imaging optical system, undue effects from ghost light can be alleviated for the optical writing unit.

Alternatively, the optical writing unit is provided with the construction similar to that mentioned just above except that the light source unit included in the optical writing unit is formed through adjustment of the lens diameter of, and the radius of curvature of the microlens, the alignment pitch of the light emitting elements, and the thickness of the transparent thin film layer such that the angle between the optical axis and a line segment, which connects the edge of a light emitting plane of an arbitrary light emitting element and the center of curvature of a neighboring microlens, is at least twice an aperture angle of the imaging optical system, in place of the angle between the optical axis and a line segment, which connects the center of a light emitting plane of an arbitrary light emitting element and the center of curvature of a neighboring microlens.

By forming the optical writing unit incorporating the optical writing units mentioned above, and by adjusting the noted angle between the optical axis and line segment to be equal to, or larger than, twice the aperture angle of the imaging optical system, undue effects from ghost light can be alleviated for the optical writing unit.

In another aspect, the image forming apparatus for forming mono-color images disclosed herein may be formed incorporating any one of the above mentioned optical writing units.

For example, the image forming apparatus for forming mono-color images is provided including at least an optical writing unit as an exposure unit that includes a light source unit comprising a plurality of light emitting elements, and an imaging optical system configured to form images of the plurality of light emitting elements, in which each of the elements is provided thereon with a microlens in one-to-one correspondence, and the microlens is hemispherical in shape and separated from a microlens neighboring thereto.

Alternatively, the image forming apparatus for forming mono-color images is provided including at least an optical writing unit as an exposure unit that includes a light source unit comprising a plurality of light emitting elements, and an imaging optical system configured to form images of the plurality of light emitting elements, in which the light emitting elements each have far-field emission angle characteristics of Lambert distribution.

Still alternatively, the image forming apparatus for forming mono-color images is provided including at least an optical writing unit as an exposure unit that includes a light source unit comprising a plurality of light emitting elements, and an imaging optical system configured to form images of the plurality of light emitting elements, in which the light source unit further includes a transparent thin film layer which is formed on the light emitting elements by laminating a material substantially transparent at an emission wavelength of the light emitting elements, and a plurality of microlenses which are formed on the transparent thin film layer to be in one-to-one correspondence to the plurality of light emitting elements.

Alternatively, the image forming apparatus for forming mono-color images is provided including at least an optical writing unit as an exposure unit that includes a light source unit comprising a plurality of light emitting elements, and an imaging optical system configured to form images of the plurality of light emitting elements, in which the plurality of light emitting elements are each self-scanning type LEDs.

Alternatively, the image forming apparatus for forming mono-color images is provided including at least an optical writing unit as an exposure unit that includes a light source unit comprising a plurality of light emitting elements, and an imaging optical system configured to form images of the plurality of light emitting elements, in which the light source unit includes at least a light emitting array comprising the plurality of light emitting elements, a transparent thin film layer formed on the light emitting array by laminating a material substantially transparent at the emission wavelength of light emitting elements; and a plurality of microlenses formed on the transparent thin film layer to be in one-to-one correspondence to the light emitting elements, and in which the light source unit is formed through adjustment of the lens diameter of, and the radius of curvature of the microlens, the alignment pitch of light emitting elements, and the thickness of the transparent thin film layer such that the angle between the optical axis and a line segment, which connects the center of a light emitting plane of an arbitrary light emitting element and the center of curvature of a neighboring microlens, is at least twice an aperture angle of the imaging optical system.

Alternatively, the image forming apparatus for forming mono-color images is provided with the construction similar to that mentioned just above except that the light source unit included in the optical writing unit is formed through adjustment of the lens diameter of, and the radius of curvature of the microlens, the alignment pitch of the light emitting elements, and the thickness of the transparent thin film layer such that the angle between the optical axis and a line segment, which connects the edge of a light emitting plane of an arbitrary light emitting element and the center of curvature of a neighboring microlens, is at least twice an aperture angle of the imaging optical system, in place of the angle between the optical axis and a line segment, which connects the center of a light emitting plane of an arbitrary light emitting element and the center of curvature of a neighboring microlens.

By means of the image forming apparatus for forming mono-color images provided herein incorporating the above mentioned optical writing unit, it becomes feasible that mono-color electrophotographic images can be output with excellent image characteristics at higher speeds.

In another aspect, the image forming apparatus for forming multiple-color images disclosed herein may be formed incorporating any one of the above mentioned optical writing units.

For example, this image forming apparatus is provided including at least an optical writing unit as an exposure unit that includes a light source unit comprising a plurality of light emitting elements, and an imaging optical system configured to form images of the plurality of light emitting elements, in which each of the elements is provided thereon with a microlens in one-to-one correspondence, and the microlens is hemispherical in shape and separated from a microlens neighboring thereto.

Alternatively, the image forming apparatus for forming multiple-color images is provided including at least an optical writing unit as an exposure unit that includes a light source unit comprising a plurality of light emitting elements, and an imaging optical system configured to form images of the plurality of light emitting elements, in which the light emitting elements each have far-field emission angle characteristics of Lambert distribution.

Still alternatively, the image forming apparatus for forming multiple-color images is provided including at least an optical writing unit as an exposure unit that includes a light source unit comprising a plurality of light emitting elements, and an imaging optical system configured to form images of the plurality of light emitting elements, in which the light source unit further includes a transparent thin film layer which is formed on the light emitting elements by laminating a material substantially transparent at an emission wavelength of the light emitting elements, and a plurality of microlenses which are formed on the transparent thin film layer to be in one-to-one correspondence to the plurality of light emitting elements.

Alternatively, the image forming apparatus for forming multiple-color images is provided including at least an optical writing unit as an exposure unit that includes a light source unit comprising a plurality of light emitting elements, and an imaging optical system configured to form images of the plurality of light emitting elements, in which the plurality of light emitting elements are each self-scanning type LEDs.

Alternatively, the image forming apparatus for forming multiple-color images is provided including at least an optical writing unit as an exposure unit that includes a light source unit comprising a plurality of light emitting elements, and an imaging optical system configured to form images of the plurality of light emitting elements, in which the light source unit includes at least a light emitting array comprising the plurality of light emitting elements, a transparent thin film layer formed on the light emitting array by laminating a material substantially transparent at the emission wavelength of light emitting elements; and a plurality of microlenses formed on the transparent thin film layer to be in one-to-one correspondence to the light emitting elements.

In addition, the light source unit is formed through adjustment of the lens diameter of, and the radius of curvature of the microlens, the alignment pitch of light emitting elements, and the thickness of the transparent thin film layer such that the angle between the optical axis and a line segment, which connects the center of a light emitting plane of an arbitrary light emitting element and the center of curvature of a neighboring microlens, is at least twice an aperture angle of the imaging optical system.

Alternatively, the image forming apparatus for forming multiple-color images is provided with the construction similar to that mentioned just above except that the light source unit included in the optical writing unit is formed through adjustment of the lens diameter of, and the radius of curvature of the microlens, the alignment pitch of the light emitting elements, and the thickness of the transparent thin film layer such that the angle between the optical axis and a line segment, which connects the edge of a light emitting plane of an arbitrary light emitting element and the center of curvature of a neighboring microlens, is at least twice an aperture angle of the imaging optical system, in place of the angle between the optical axis and a line segment, which connects the center of a light emitting plane of an arbitrary light emitting element and the center of curvature of a neighboring microlens.

By means of the image forming apparatus for forming mono-color images provided herein incorporating the above mentioned optical writing unit, it becomes feasible that multiple-color electrophotographic images can be output with excellent image characteristics at higher speeds.

In another aspect, the image forming apparatus for forming multiple-color images is provided comprising a plurality of optical writing units each in use for respective multiple colors as exposure units.

For example, this image forming apparatus for forming multiple-color images is provided including a plurality of the above mentioned optical writing units each in use for respective multiple colors as exposure units, each of which including a light source unit comprising a plurality of light emitting elements, and an imaging optical system configured to form images of the plurality of light emitting elements, in which each of the elements is provided thereon with a microlens in one-to-one correspondence, and the microlens is hemispherical in shape and separated from a microlens neighboring thereto.

Alternatively, the image forming apparatus for forming multiple-color images is provided including at least a plurality of optical writing units as exposure units, each of which includes a light source unit comprising a plurality of light emitting elements, and an imaging optical system configured to form images of the plurality of light emitting elements, in which the light emitting elements each have far-field emission angle characteristics of Lambert distribution.

Still alternatively, the image forming apparatus for forming multiple-color images is provided including at least a plurality of optical writing units as exposure units, each of which includes a light source unit comprising a plurality of light emitting elements, and an imaging optical system configured to form images of the plurality of light emitting elements, in which the light source unit further includes a transparent thin film layer which is formed on the light emitting elements by laminating a material substantially transparent at an emission wavelength of the light emitting elements, and a plurality of microlenses which are formed on the transparent thin film layer to be in one-to-one correspondence to the plurality of light emitting elements.

Alternatively, the image forming apparatus for forming multiple-color images is provided including at least a plurality of optical writing units as exposure units, each of which includes a light source unit comprising a plurality of light emitting elements, and an imaging optical system configured to form images of the plurality of light emitting elements, in which the plurality of light emitting elements are each self-scanning type LEDs.

Alternatively, the image forming apparatus for forming multiple-color images is provided including at least a plurality of the above mentioned optical writing units as exposure units, each of which includes a light source unit comprising a plurality of light emitting elements, and an imaging optical system configured to form images of the plurality of light emitting elements, in which the light source unit includes at least a light emitting array comprising the plurality of light emitting elements, a transparent thin film layer formed on the light emitting array by laminating a material substantially transparent at the emission wavelength of light emitting elements; and a plurality of microlenses formed on the transparent thin film layer to be in one-to-one correspondence to the light emitting elements; and in which the light source unit is formed through adjustment of the lens diameter of, and the radius of curvature of the microlens, the alignment pitch of light emitting elements, and the thickness of the transparent thin film layer such that the angle between the optical axis and a line segment, which connects the center of a light emitting plane of an arbitrary light emitting element and the center of curvature of a neighboring microlens, is at least twice an aperture angle of the imaging optical system.

Alternatively, the image forming apparatus for forming multiple-color images is provided with the construction similar to that mentioned just above except that the light source unit is formed through adjustment of the lens diameter of, and the radius of curvature of the microlens, the alignment pitch of the light emitting elements, and the thickness of the transparent thin film layer such that the angle between the optical axis and a line segment, which connects the edge of a light emitting plane of an arbitrary light emitting element and the center of curvature of a neighboring microlens, is at least twice an aperture angle of the imaging optical system, in place of the angle between the optical axis and a line segment, which connects the center of a light emitting plane of an arbitrary light emitting element and the center of curvature of a neighboring microlens.

By means of the image forming apparatus for forming mono-color images provided herein incorporating the above mentioned optical writing unit, it becomes feasible that multiple-color electrophotographic images can be output with excellent image characteristics at higher speeds, and that images in a certain color on demand can be output at higher speeds.

The apparatuses and process steps set forth in the present description may therefore be implemented using suitable host computers and terminals incorporating appropriate processors programmed according to the teachings disclosed herein, as will be appreciated to those skilled in the relevant arts.

Therefore, the present invention also includes a computer-based product which may be hosted on a storage medium and include instructions which can be used to program a processor to perform a process in accordance with the present invention. The storage medium can include, but is not limited to, any type of disk including floppy disks, optical disks, CD-ROMS, magneto-optical disks, ROMs, RAMs, EPROMs, EEPROMS, flash memory, magnetic or optical cards, or any type of media suitable for storing electronic instructions.

It is apparent from the above description including example, the light emitting array disclosed herein is formed having several improved capabilities such as reduced radiation angles, obviated generation of light flare, and increased light transmission efficiency.

The light emitting array may suitably be incorporated into the light source unit together with a transparent thin film layer and microlenses.

By properly adjusting the thickness of transparent thin film layer and the diameter of each microlens, it becomes feasible in the light source unit for the light beams emanated from the light emitting elements to be brought into a range suitable for the aperture angle of the microlens and for the light intensity sufficient to the imaging optical system to be attained. In addition, the light transmission efficiency is increased and stable light spots are formed.

Furthermore, image forming apparatuses disclosed herein for forming mono-color or multiple-color images may be formed incorporating the above mentioned optical writing units.

As a result, it becomes feasible that electrophotographic images can be output with excellent image characteristics at higher speeds, and that images in a certain color on demand can be output at higher speeds.

While the exemplary system and unit described herein is presently considered to be preferred, various other modifications or improvements will be apparent to those skilled in the art. The following claims are intended to cover all such variations and modifications as fall within the true spirit and scope of the invention.

This document claims priority and contains subject matter related to Japanese Patent Applications No. 2003-202484, 2003-386692, and 2004-111163, filed with the Japanese Patent Office on Jul. 28, 2003, Nov. 17, 2003, and Apr. 5, 2004, respectively, the entire contents of which are hereby incorporated by reference.

What is claimed is:

1. A light source unit, comprising:
a light emitting array comprising a plurality of light emitting elements, said plurality of light emitting elements being formed in line;
a transparent thin film layer, said transparent thin film layer being formed on said light emitting array by laminating a material substantially transparent at an emission wavelength of said plurality of light emitting elements;
a plurality of microlenses, said plurality of microlenses being formed on said transparent thin film layer to be in one-to-one correspondence to said plurality of light emitting elements; and
a microlens of said plurality of microlenses configured to have a radiation angle of a light beam from a corresponding light emitting element of said plurality of light emitting elements passing through said microlens, said radiation angle having a value of at least 20 degrees, wherein
said light source unit is formed so as to satisfy relational expressions, including $T1 \leq 2 \cdot D2$ and $$\theta_A \geq 2 \cdot \tan^{-1}\left(\frac{P}{T1 - \sqrt{R^2 - (D2/2)^2}}\right),$$

where T1 is a thickness of said transparent thin film layer, D2 is a diameter of each of said plurality of microlenses, P is a length of an alignment pitch between adjacent light emitting elements of said plurality of light emitting elements, R is a curvature radius of each of said plurality of microlenses, and $\theta_A$ is an angle between centers of curvature of adjacent microlenses of said plurality of microlenses as measured from a light emitting element of said plurality of light emitting elements corresponding to one of said adjacent microlenses.

2. The light source unit according to claim 1, wherein a center of curvature of each of said plurality of microlenses is situated between a light emitting plane of each of said plurality of light emitting elements and each of said plurality of microlenses opposing to said light emitting plane.

3. The light source unit according to claim 2, wherein a film layer opaque at an emission wavelength of said plurality of light emitting elements is provided for light shielding on a surface area other than an effective area of curved surfaces of said plurality of microlenses.

4. The light source unit according to claim 2, wherein said transparent thin film layer and said plurality of microlenses are formed to be substantially equal in refractive index to each other.

5. The light source unit according to claim 2, wherein a refractive index of said transparent thin film layer is smaller than that of said plurality of microlenses.

6. The light source unit according to claim 2, wherein said transparent thin film layer is formed by a film forming method.

7. The light source unit according to claim 2, wherein said transparent thin film layer is formed by a solvent coating method.

8. The light source unit according to claim 2, wherein said transparent thin film layer is formed of a photoresist material substantially transparent at an emission wavelength of said plurality of light emitting elements.

9. The light source unit according to claim 2, wherein said plurality of light emitting elements each have far-field emission angle characteristics of Lambert distribution.

10. The light source unit according to claim 9, wherein said plurality of light emitting elements are each self-scanning LEDs.

11. The light source unit according to claim 1, wherein
a film layer opaque at an emission wavelength of said plurality of light emitting elements is provided for light shielding on a surface area other than an effective area of curved surfaces of said plurality of microlenses.

12. The light source unit according to claim 1, wherein said transparent thin film layer and said plurality of microlenses are formed to be substantially equal in refractive index to each other.

13. The light source unit according to claim 1, wherein a refractive index of said transparent thin film layer is smaller than that of said plurality of microlenses.

14. The light source unit according to claim 1, wherein said transparent thin film layer is formed by a film forming method.

15. The light source unit according to claim 1, wherein said transparent thin film layer is formed by a solvent coating method.

16. The light source unit according to claim 1, wherein said transparent thin film layer is formed of a photoresist material substantially transparent at an emission wavelength of said plurality of light emitting elements.

17. The light source unit according to claim 1, wherein said plurality of light emitting elements each have far-field emission angle characteristics of Lambert distribution.

18. The light source unit according to claim 17, wherein said plurality of light emitting elements are each self-scanning LEDs.

19. An optical writing unit, comprising:
a light source unit comprising a plurality of light emitting elements; and
an imaging optical system configured to form images of said plurality of light emitting elements, wherein
said light source unit further includes a two layer structure having
a first layer which is a transparent thin film layer which is formed on said plurality of light emitting elements by laminating a material substantially transparent at an emission wavelength of said plurality of light emitting elements, and
a second layer which is a plurality of microlenses which are formed on said transparent thin film layer to be in one-to-one correspondence to said plurality of light emitting elements,
wherein the first and second layers are different materials,
a microlens of said plurality of microlenses is configured to have a radiation angle of a light beam from a corresponding light emitting element of said plurality of light emitting elements passing through said microlens, said radiation angle having a value of at least 20 degrees, and
said light source unit satisfies a relational expression, $$\theta_A \geq 2 \cdot \tan^{-1}\left(\frac{P}{T1 - \sqrt{R^2 - (D2/2)^2}}\right),$$

where T1 is a thickness of said transparent thin film layer, D2 is a diameter of each of said plurality of microlenses, P is a length of an alignment pitch between adjacent light emitting elements of said plurality of light emitting elements, R is a curvature radius of each of said plurality of microlenses, and $\theta_A$ is an angle between centers of curvature of adjacent microlenses of said plurality of microlenses as measured from a light emitting element of said plurality of light emitting elements corresponding to one of said adjacent microlenses.

20. The optical writing unit according to claim 19, wherein the first layer has an index of refraction of N1 and the second layer has an index of refraction of N2, and N1 is equal to N2.

21. The optical writing unit according to claim 19, wherein the first layer has an index of refraction of N1 and the second layer has an index of refraction of N2, and N1 is less than N2.

22. The optical writing unit according to claim 19, wherein said plurality of light emitting elements are each self-scanning LEDs.

23. An image forming apparatus for forming mono-color images, comprising:
an optical writing unit;
said optical writing unit comprising
(a) a light source unit comprising a plurality of light emitting elements; and
(b) an imaging optical system configured to form images of said plurality of light emitting elements; wherein
said light source unit further includes a two layer structure having
a first layer which is a transparent thin film layer which is formed on said plurality of light emitting elements by laminating a material substantially transparent at an emission wavelength of said plurality of light emitting elements, and
a second layer which is a plurality of microlenses which are formed on said transparent thin film layer to be in one-to-one correspondence to said plurality of light emitting elements,
wherein the first and second layers are different materials,
a microlens of said plurality of microlenses is configured to have a radiation angle of a light beam from a corresponding light emitting element of said plurality of light emitting elements passing through said microlens, said radiation angle having a value of at least 20 degrees, and
said light source unit satisfies a relational expression, $$\theta_A \geq 2 \cdot \tan^{-1}\left(\frac{P}{T1 - \sqrt{R^2 - (D2/2)^2}}\right),$$

where T1 is a thickness of said transparent thin film layer, D2 is a diameter of each of said plurality of microlenses, P is a length of an alignment pitch between adjacent light emitting elements of said plurality of light emitting elements, R is a curvature radius of each of said plurality of microlenses, and $\theta_A$ is an angle between centers of curvature of adjacent microlenses of said plurality of microlenses as measured from a light emitting element of said plurality of light emitting elements corresponding to one of said adjacent microlenses.

24. The image forming apparatus according to claim 23, wherein said plurality of light emitting elements are each self-scanning LEDs.

25. An image forming apparatus for forming multiple-color images, comprising:
an optical writing unit configured for multiple colors in common;

said optical writing unit comprising
(a) a light source unit comprising a plurality of light emitting elements; and
(b) an imaging optical system configured to form images of said plurality of light emitting elements; wherein
said light source unit further includes a two layer structure having
a first layer which is a transparent thin film layer which is formed on said plurality of light emitting elements by laminating a material substantially transparent at an emission wavelength of said plurality of light emitting elements, and
a second layer which is a plurality of microlenses which are formed on said transparent thin film layer to be in one-to-one correspondence to said plurality of light emitting elements,
wherein the first and second layers are different materials,
a microlens of said plurality of microlenses is configured to have a radiation angle of a light beam from a corresponding light emitting element of said plurality of light emitting elements passing through said microlens, said radiation angle having a value of at least 20 degrees, and
said light source unit satisfies a relational expression, $$\theta_A \geq 2 \cdot \tan^{-1}\left(\frac{P}{T1 - \sqrt{R^2 - (D2/2)^2}}\right),$$

where T1 is a thickness of said transparent thin film layer, D2 is a diameter of each of said plurality of microlenses, P is a length of an alignment pitch between adjacent light emitting elements of said plurality of light emitting elements, R is a curvature radius of each of said plurality of microlenses, and $\theta_A$ is an angle between centers of curvature of adjacent microlenses of said plurality of microlenses as measured from a light emitting element of said plurality of light emitting elements corresponding to one of said adjacent microlenses.

26. The image forming apparatus according to claim 25, wherein said plurality of light emitting elements are each self-scanning LEDs.

27. An image forming apparatus for forming multiple-color images, comprising:
a plurality of optical writing units each configured for respective multiple colors;
each of said plurality of optical writing units comprising
(a) a light source unit comprising a plurality of light emitting elements; and
(b) an imaging optical system configured to form images of said plurality of light emitting elements; wherein
said light source unit further includes a two layer structure having
a first layer which is a transparent thin film layer which is formed on said plurality of light emitting elements by laminating a material substantially transparent at an emission wavelength of said plurality of light emitting elements, and
a second layer which is a plurality of microlenses which are formed on said transparent thin film layer to be in one-to-one correspondence to said plurality of light emitting elements,
wherein the first and second layers are different materials,
a microlens of said plurality of microlenses is configured to have a radiation angle of a light beam from a corresponding light emitting element of said plurality of light emitting elements passing through said microlens, said radiation angle having a value of at least 20 degrees, and
said light source unit satisfies a relational expression, $$\theta_A \geq 2 \cdot \tan^{-1}\left(\frac{P}{T1 - \sqrt{R^2 - (D2/2)^2}}\right),$$

where T1 is a thickness of said transparent thin film layer, D2 is a diameter of each of said plurality of microlenses, P is a length of an alignment pitch between adjacent light emitting elements of said plurality of light emitting elements, R is a curvature radius of each of said plurality of microlenses, and $\theta_A$ is an angle between centers of curvature of adjacent microlenses of said plurality of microlenses as measured from a light emitting element of said plurality of light emitting elements corresponding to one of said adjacent microlenses.

28. The image forming apparatus according to claim 27, wherein said plurality of light emitting elements are each self-scanning LEDs.

29. A light source unit, comprising:
a light emitting array comprising a plurality of light emitting elements formed in line;
a transparent thin film layer formed on said light emitting array by laminating a material substantially transparent at an emission wavelength of said plurality of light emitting elements;
a plurality of microlenses formed on said transparent thin film layer to be in one-to-one correspondence to said plurality of light emitting elements; and
a microlens of said plurality of microlenses configured to have a radiation angle of a light beam from a corresponding light emitting element of said plurality of light emitting elements passing through said microlens, wherein
said light source unit is formed so as to satisfy relational expressions, including $$T1 \leq 2 \cdot D2, \text{ and}$$

$$\theta_A \geq 2 \cdot \tan^{-1}\left(\frac{P}{T1 - \sqrt{R^2 - (D2/2)^2}}\right),$$

where T1 is a thickness of said transparent thin film layer, D2 is a diameter of each of said plurality of microlenses, P is a length of an alignment pitch between adjacent light emitting elements of said plurality of light emitting elements, R is a curvature radius of each of said plurality of microlenses, and $\theta_A$ is an angle between centers of curvature of adjacent microlenses of said plurality of microlenses as measured from a light emitting element of said plurality of light emitting elements corresponding to one of said adjacent microlenses.

30. An optical writing unit, comprising:
a light source means; and
an imaging optical means for forming images of a plurality of light emitting elements included in said light source means; wherein said light source means includes at least a two layer having
a first layer which is a transparent thin film layer which is formed on said plurality of light emitting elements by laminating a material substantially transparent at an emission wavelength of said plurality of light emitting elements, and
a second layer which is a plurality of microlenses which are formed on said transparent thin film layer to be in one-to-one correspondence to said plurality of light emitting elements,
wherein the first and second layers are different materials,
a microlens of said plurality of microlenses is configured to have a radiation angle of a light beam from a corresponding light emitting element of said plurality of light emitting elements passing through said microlens, said radiation angle having a value of at least 20 degrees, and
said light source means satisfies a relational expression, $$\theta_A \geq 2 \cdot \tan^{-1}\left(\frac{P}{T1 - \sqrt{R^2 - (D2/2)^2}}\right),$$

where T1 is a thickness of said transparent thin film layer, D2 is a diameter of each of said plurality of microlenses, P is a length of an alignment pitch between adjacent light emitting elements of said plurality of light emitting elements, R is a curvature radius of each of said plurality of microlenses, and $\theta_A$ is an angle between centers of curvature of adjacent microlenses of said plurality of microlenses as measured from a light emitting element of said plurality of light emitting elements corresponding to one of said adjacent microlenses.

31. The optical writing unit according to claim 30, wherein said plurality of light emitting elements are each self-scanning LEDs.

32. An image forming apparatus for forming mono-color images, comprising:
an optical writing means as an exposure means;
said optical writing means comprising
(a) a light source means; and
(b) an imaging optical means for forming images of a plurality of light emitting elements included in said light source means; wherein
said light source means includes at least a two layer structure having
a first layer which is a transparent thin film layer which is formed on said plurality of light emitting elements by laminating a material substantially transparent at an emission wavelength of said plurality of light emitting elements, and
a second layer which is a plurality of microlenses which are formed on said transparent thin film layer to be in one-to-one correspondence to said plurality of light emitting elements,
wherein the first and second layers are different materials,
a microlens of said plurality of microlenses is configured to have a radiation angle of a light beam from a corresponding light emitting element of said plurality of light emitting elements passing through said microlens, said radiation angle having a value of at least 20 degrees, and
said light source means satisfies a relational expression, $$\theta_A \geq 2 \cdot \tan^{-1}\left(\frac{P}{T1 - \sqrt{R^2 - (D2/2)^2}}\right),$$

where T1 is a thickness of said transparent thin film layer, D2 is a diameter of each of said plurality of microlenses, P is a length of an alignment pitch between adjacent light emitting elements of said plurality of light emitting elements, R is a curvature radius of each of said plurality of microlenses, and $\theta_A$ is an angle between centers of curvature of adjacent microlenses of said plurality of microlenses as measured from a light emitting element of said plurality of light emitting elements corresponding to one of said adjacent microlenses.

33. The image forming apparatus according to claim 32, wherein said plurality of light emitting elements are each self-scanning LEDs.

34. An image forming apparatus for forming multiple-color images, comprising:
an optical writing means as an exposure means in use for multiple colors in common;
said optical writing means comprising
(a) a light source means; and
(b) an imaging optical means for forming images of a plurality of light emitting elements included in said light source means; wherein
said light source means includes at least a two layer structure having
a first layer which is a transparent thin film layer which is formed on said plurality of light emitting elements by laminating a material substantially transparent at an emission wavelength of said plurality of light emitting elements, and
a second layer which is a plurality of microlenses which are formed on said transparent thin film layer to be in one-to-one correspondence to said plurality of light emitting elements,
wherein the first and second layers are different materials,
a microlens of said plurality of microlenses is configured to have a radiation angle of a light beam from a corresponding light emitting element of said plurality of light emitting elements passing through said microlens, said radiation angle having a value of at least 20 degrees, and
said light source means satisfies a relational expression, $$\theta_A \geq 2 \cdot \tan^{-1}\left(\frac{P}{T1 - \sqrt{R^2 - (D2/2)^2}}\right),$$

where T1 is a thickness of said transparent thin film layer, D2 is a diameter of each of said plurality of microlenses, P is a length of an alignment pitch between adjacent light emitting elements of said plurality of light emitting elements, R is a curvature radius of each of said plurality of microlenses, and $\theta_A$ is an angle between centers of curvature of adjacent microlenses of said plurality of microlenses as measured from a light emitting element of said plurality of light emitting elements corresponding to one of said adjacent microlenses.

35. The image forming apparatus according to claim 34, wherein said plurality of light emitting elements are each self-scanning LEDs.

36. An image forming apparatus for forming multiple-color images, comprising:
- a plurality of optical writing means each in use for respective multiple colors as exposure means;
- said optical writing means comprising
  - (a) a light source means; and
  - (b) an imaging optical means for forming images of a plurality of light emitting elements, said plurality of light emitting elements being included in said light source means; wherein
- said light source means includes at least a two layer structure having
  - a first layer which is a transparent thin film layer which is formed on said plurality of light emitting elements by laminating a material substantially transparent at an emission wavelength of said plurality of light emitting elements, and
  - a second layer which is a plurality of microlenses which are formed on said transparent thin film layer to be in one-to-one correspondence to said plurality of light emitting elements,
- wherein the first and second layers are different materials,
- a microlens of said plurality of microlenses is configured to have a radiation angle of a light beam from a corresponding light emitting element of said plurality of light emitting elements passing through said microlens, said radiation angle having a value of at least 20 degrees, and said light source means satisfies a relational expression, $$\theta_A \geq 2 \cdot \tan^{-1}\left(\frac{P}{T1 - \sqrt{R^2 - (D2/2)^2}}\right),$$

where T1 is a thickness of said transparent thin film layer, D2 is a diameter of each of said plurality of microlenses, P is a length of an alignment pitch between adjacent light emitting elements of said plurality of light emitting elements, R is a curvature radius of each of said plurality of microlenses, and $\theta_A$ is an angle between centers of curvature of adjacent microlenses of said plurality of microlenses as measured from a light emitting element of said plurality of light emitting elements corresponding to one of said adjacent microlenses.

37. The image forming apparatus according to claim 36, wherein said plurality of light emitting elements are each self-scanning LEDs.

* * * * *